US012592719B2

(12) United States Patent
Chen et al.

(10) Patent No.: US 12,592,719 B2
(45) Date of Patent: Mar. 31, 2026

(54) DECODERS FOR DECODING A CODEWORD OF A TUNSTALL CODE

(71) Applicants: NANYANG TECHNOLOGICAL UNIVERSITY, Singapore (SG); AGENCY FOR SCIENCE, TECHNOLOGY AND RESEARCH, Singapore (SG)

(72) Inventors: Chunyun Chen, Singapore (SG); Mohamed Mostafa Sabry Aly, Singapore (SG); Zhe Wang, Singapore (SG); Jie Lin, Singapore (SG)

(73) Assignees: NANYANG TECHNOLOGICAL UNIVERSITY, Singapore (SG); AGENCY FOR SCIENCE, TECHNOLOGY AND RESEARCH, Singapore (SG)

( * ) Notice: Subject to any disclaimer, the term of this patent is extended or adjusted under 35 U.S.C. 154(b) by 119 days.

(21) Appl. No.: 18/717,310

(22) PCT Filed: Dec. 6, 2022

(86) PCT No.: PCT/SG2022/050887
§ 371 (c)(1),
(2) Date: Jun. 6, 2024

(87) PCT Pub. No.: WO2023/107007
PCT Pub. Date: Jun. 15, 2023

(65) Prior Publication Data
US 2025/0055478 A1 Feb. 13, 2025

(30) Foreign Application Priority Data
Dec. 6, 2021 (SG) ............................ 10202113561S

(51) Int. Cl.
*H03M 7/30* (2006.01)
*H03M 7/40* (2006.01)

(52) U.S. Cl.
CPC ........... *H03M 7/6005* (2013.01); *H03M 7/40* (2013.01)

(58) Field of Classification Search
CPC ......... H03M 7/30; H03M 7/40; H03M 7/6005
See application file for complete search history.

(56) References Cited

U.S. PATENT DOCUMENTS 5,583,500 A * 12/1996 Allen ...................... H03M 7/42
                                                      341/51
7,039,846 B2 * 5/2006 Hewitt .................. H04L 1/0066
                                                      714/755

(Continued)

OTHER PUBLICATIONS

International Search Report and Written Opinion for PCT/SG2022/050887 (ISA/SG) mailed Jun. 22, 2023 (11 pages).

(Continued)

*Primary Examiner* — Lam T Mai
(74) *Attorney, Agent, or Firm* — ALSTON & BIRD LLP

(57) ABSTRACT

A decoder for decoding a codeword of a Tunstall code is provided, including: a sub-decoder configured to receive an input codeword of the Tunstall code to the decoder and output a decoded symbol of the input codeword; a symbol memory configured to receive and store the decoded symbol of the input codeword from the sub-decoder; and a controller configured to control the symbol memory to output one or more decoded symbols stored in the symbol memory. The sub-decoder includes: a node memory configured to store, for a plurality of nodes of a Tunstall tree of the Tunstall code corresponding to a first level of the Tunstall tree, a plurality of codewords of the Tunstall code assigned to the plurality of nodes, respectively; and a comparator configured to compare the input codeword with the plurality of codewords (Continued)

100

108 Controller — Symbol Memory — 106

Sub-Decoder

114 — Comparator — 104

112 — Node Memory assigned to the plurality of nodes corresponding to the first level of the Tunstall tree received from the node memory and produce the decoded symbol of the input codeword with respect to the first level of the Tunstall tree based on the comparison. Another decoder for decoding a codeword of a Tunstall code is also provided, including: a symbol memory comprising a plurality of memory entries, each memory entry having stored therein one or more decoded symbols of a codeword of the Tunstall code corresponding to the memory entry; and a controller configured to receive an input codeword of the Tunstall code to the decoder and control the symbol memory to output the one or more decoded symbols stored in one of the plurality of memory entries corresponding to the input codeword.

20 Claims, 19 Drawing Sheets

(56) References Cited

U.S. PATENT DOCUMENTS

| | | | | |
|---|---|---|---|---|
| 7,071,846 | B2 * | 7/2006 | Moerz | H03M 13/3916 |
| | | | | 341/51 |
| 7,095,343 | B2 | 8/2006 | Xie et al. | |
| 7,631,248 | B2 * | 12/2009 | Zakharchenko | H03M 13/3746 |
| | | | | 714/755 |
| 8,004,431 | B2 * | 8/2011 | Reznik | H03M 7/40 |
| | | | | 341/67 |
| 8,868,999 | B1 * | 10/2014 | Varnica | H03M 13/373 |
| | | | | 714/752 |
| 10,560,221 | B2 * | 2/2020 | Saber | H04J 13/004 |
| 2003/0044074 | A1 * | 3/2003 | Weiss | G06F 9/3017 |
| | | | | 382/233 |
| 2010/0141489 | A1 * | 6/2010 | Reznik | H03M 7/40 |
| | | | | 341/67 |
| 2018/0191465 | A1 * | 7/2018 | Saber | H04L 1/0076 |
| 2022/0006476 | A1 * | 1/2022 | Hamelin | H03M 13/3977 |
| 2025/0150092 | A1 * | 5/2025 | Cooper | H03M 7/42 |

OTHER PUBLICATIONS

Xie, Y et al., "*Code Compression for Embedded VLIW Processors Using Variable-to-Fixed Coding,*" IEEE Transactions on Very Large Scale Integration (VLSI) Systems, May 31, 2006, vol. 14, No. 5, pp. 525-536.

Yoshida, S et al., "*An Efficient Variable-to-Fixed Length Encoding Using Multiplexed Parse Trees,*" Journal of Discrete Algorithms, Nov. 13, 2014, vol. 32, pp. 75-86.

Salomon, D. (2004). *Data compression: the complete reference.* Springer Science & Business Media.

S. Han, H. Mao, and W. J. Dally, "Deep compression: Compressing deep neural networks with pruning, trained quantization and Huffman coding," arXiv preprint arXiv:1510.00149, 2015.

Y. He, X. Zhang, and J. Sun, "Channel pruning for accelerating very deep neural networks," in Proceedings of the IEEE International Conference on Computer Vision, 2017, pp. 1389-1397.

J.-H. Luo, J. Wu, and W. Lin, "Thinet: a filter level pruning method for deep neural network compression," in Proceedings of the IEEE international conference on computer vision, 2017, pp. 5058-5066.

X. He, Z. Zhou, and L. Thiele, "Multi-task zipping via layer-wise neuron sharing," in Advances in Neural Information Processing Systems, 2018, pp. 6016-6026.

R. Mishra, H. P. Gupta, and T. Dutta, "A survey on deep neural network compression: Challenges, overview, and solutions," arXiv preprint arXiv:2010.03954, 2020.

Y. Cheng, D. Wang, P. Zhou, and T. Zhang, "A survey of model compression and acceleration for deep neural networks," arXiv preprint arXiv:1710.09282, 2017.

J. Choi, Z. Wang, S. Venkataramani, P. I.-J. Chuang, V. Srinivasan, and K. Gopalakrishnan, "Pact: Parameterized clipping activation for quantized neural networks," arXiv preprint arXiv:1805.06085, 2018.

D. Zhang, J. Yang, D. Ye, and G. Hua, "Lq-nets: Learned quantization for highly accurate and compact deep neural networks," in Proceedings of the European conference on computer vision (ECCV), 2018, pp. 365-382.

A. Zhou, A. Yao, Y. Guo, L. Xu, and Y. Chen, "Incremental network quantization: Towards lossless cnns with low-precision weights," arXiv preprint arXiv:1702.03044, 2017.

S. Recanatesi, M. Farrell, M. Advani, T. Moore, G. Lajoie, and E. Shea-Brown, "Dimensionality compression and expansion in deep neural networks," arXiv preprint arXiv:1906.00443, 2019.

D. Oktay, J. Ball'e, S. Singh, and A. Shrivastava, "Scalable model compression by entropy penalized reparameterization," arXiv preprint arXiv:1906.06624, 2019.

S. Wiedemann et al., "Deepcabac: Context-adaptive binary arithmetic coding for deep neural network compression," arXiv preprint arXiv:1905.08318, 2019.

A. Dubey, M. Chatterjee, and N. Ahuja, "Coreset-based neural network compression," in Proceedings of the European Conference on Computer Vision (ECCV), 2018, pp. 454-470.

J. Bachrach, H. Vo, B. Richards, Y. Lee, A. Waterman, R. Avizienis, J. Wawrzynek, and K. Asanovi'c, "Chisel: constructing hardware in a scala embedded language," in DAC Design Automation Conference 2012. IEEE, 2012, pp. 1212-1221.

K. He, X. Zhang, S. Ren, and J. Sun, "Deep residual learning for image recognition," in Proceedings of the IEEE conference on computer vision and pattern recognition, 2016, pp. 770-778.

M. Sandler, A. Howard, M. Zhu, A. Zhmoginov, and L.-C. Chen, "Mobilenetv2: Inverted residuals and linear bottlenecks," in Proceedings of the IEEE conference on computer vision and pattern recognition, 2018, pp. 4510-4520.

S. Han, X. Liu, H. Mao, J. Pu, A. Pedram, M. A. Horowitz, and W. J. Dally, "Eie: efficient inference engine on compressed deep neural network," ACM SIGARCH Computer Architecture News, vol. 44, No. 3, pp. 243-254, 2016.

Y.-H. Chen, T.-J. Yang, J. Emer, and V. Sze, "Eyeriss v2: A flexible accelerator for emerging deep neural networks on mobile devices," IEEE Journal on Emerging and Selected Topics in Circuits and Systems, vol. 9, No. 2, pp. 292-308, 2019.

T. H. Cormen, C. E. Leiserson, R. L. Rivest, and C. Stein, Introduction to algorithms. MIT press, 2009.

M. Rabbani, "Jpeg2000: Image compression fundamentals, standards and practice," Journal of Electronic Imaging, vol. 11, No. 2, p. 286, 2002.

I. H. Witten, R. M. Neal, and J. G. Cleary, "Arithmetic coding for data compression," Communications of the ACM, vol. 30, No. 6, pp. 520-540, 1987.

Zhe et al., "Rate-distortion Optimized Coding for Efficient CNN Compression", 2021 Data Compression Conference (DCC), pp. 253-262, Mar. 23-26, 2021.

Klein, "On Improving Tunstall Codes", Information Processing and Management, 47(5), pp. 777-785, Sep. 2011.

Adigopula, "Data Compression using Efficient Dictionary Selection Method", International Journal of Computer and Communication Technology, vol. 6, Issue 2, pp. 117-121, Apr. 2015.

* cited by examiner

100

200

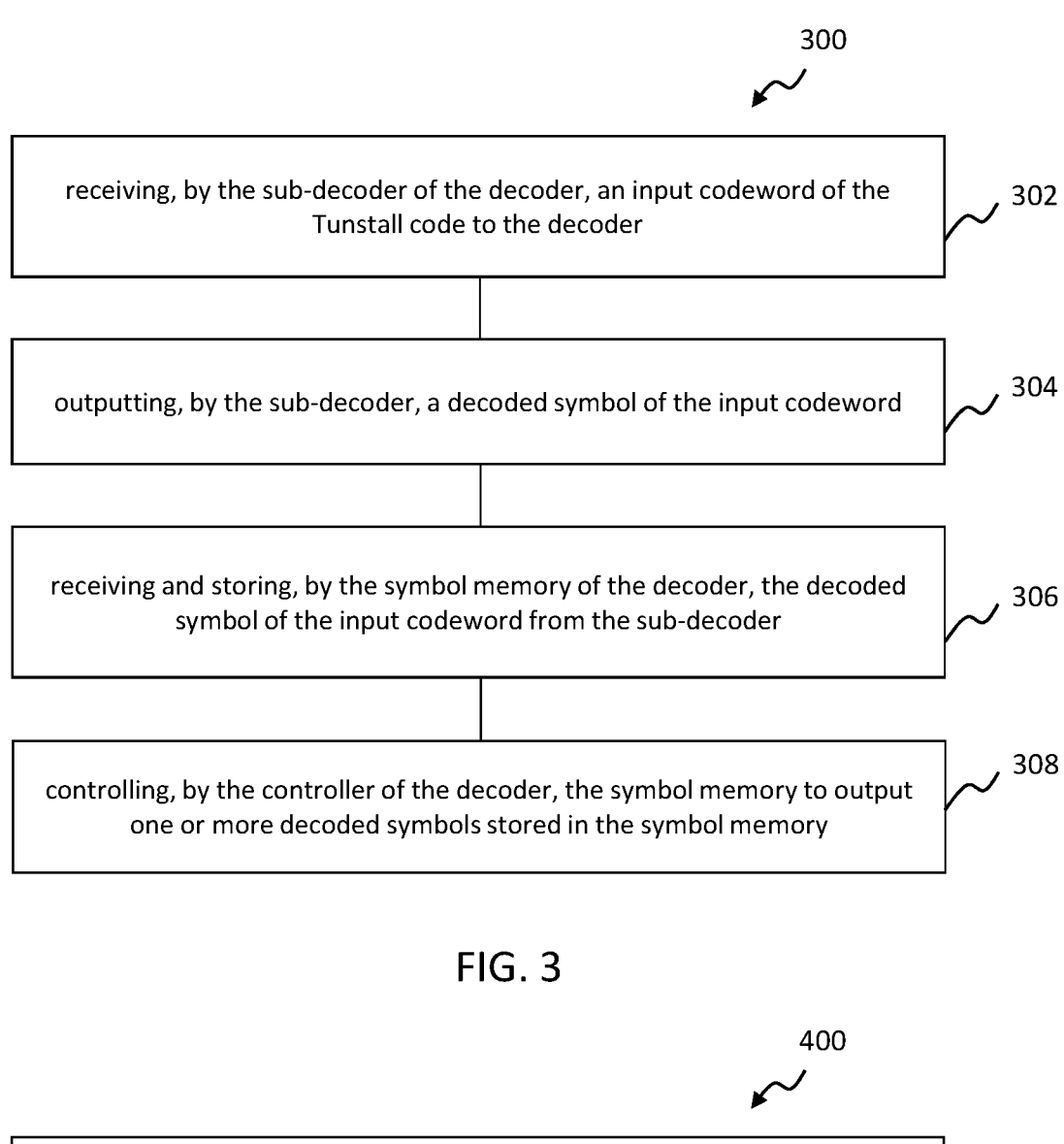

300 receiving, by the sub-decoder of the decoder, an input codeword of the Tunstall code to the decoder ~ 302 outputting, by the sub-decoder, a decoded symbol of the input codeword ~ 304 receiving and storing, by the symbol memory of the decoder, the decoded symbol of the input codeword from the sub-decoder ~ 306 controlling, by the controller of the decoder, the symbol memory to output one or more decoded symbols stored in the symbol memory ~ 308

FIG. 3

400 receiving, by the controller of the decoder, an input codeword of the Tunstall code ~ 402 controlling, by the controller of the decoder, the symbol memory to output one or more decoded symbols stored in one of the plurality of memory entries corresponding to the input codeword ~ 404

FIG. 4

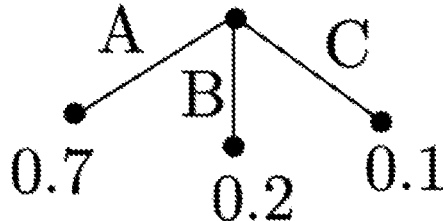
FIG. 5A
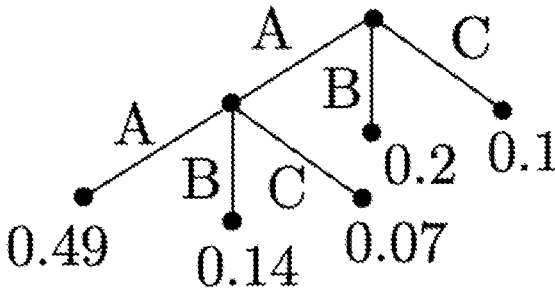
FIG. 5B
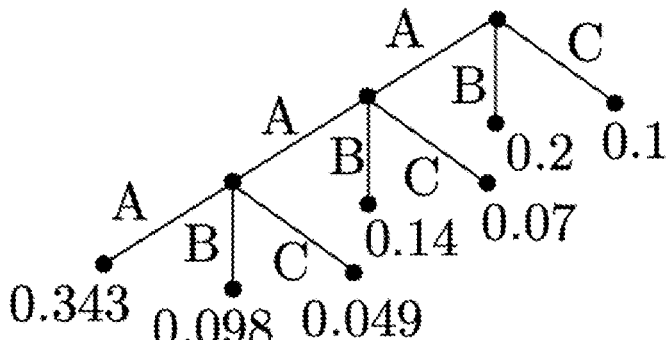
FIG. 5C
TABLE I
THE CODEBOOK OF THE EXAMPLE TUNSTALL TREE
| Codeword | 000 | 001 | 010 | 011 | 100 | 101 | 110 |
|----------|-----|-----|-----|-----|-----|-----|-----|
| Symbols  | AAA | AAB | AAC | AB  | AC  | B   | C   |
FIG. 6

---

Figure 8:
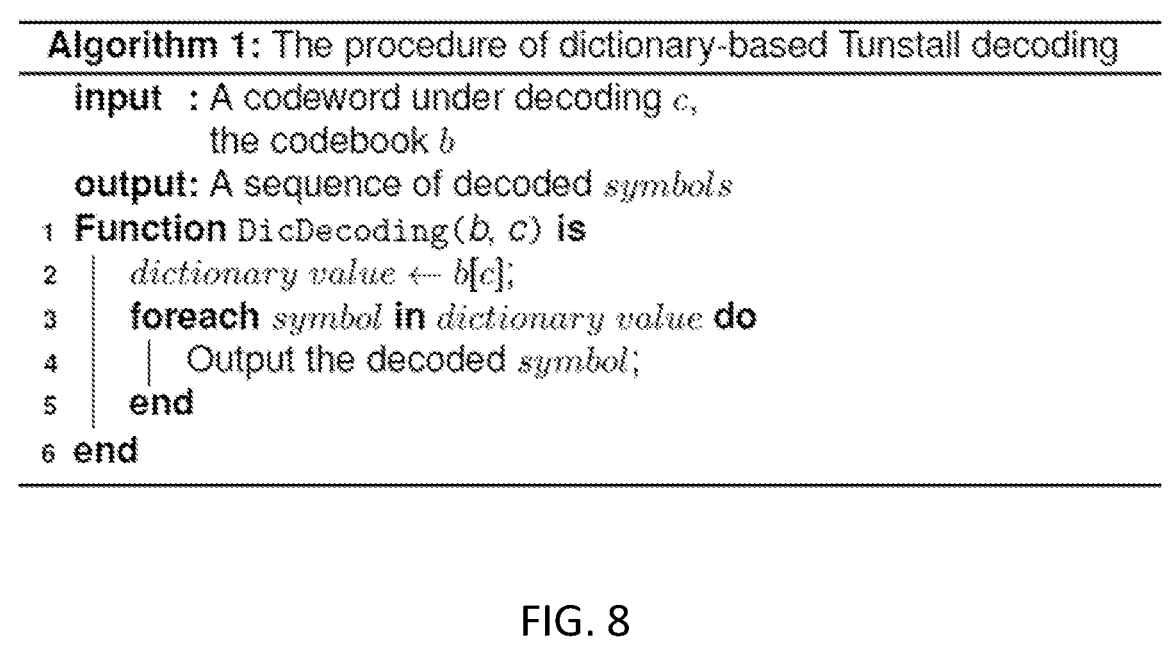

Algorithm 1: The procedure of dictionary-based Tunstall decoding input  : A codeword under decoding $c$,
              the codebook $b$
    output: A sequence of decoded *symbols*

1   Function DicDecoding($b$, $c$) is
2        *dictionary value* $\leftarrow$ $b[c]$;
3        foreach *symbol* in *dictionary value* do
4            Output the decoded *symbol*;
5        end
6   end

| 32    28 | 27    23 | 22    18 | 17    13 | 12    8 | 7    3 | 2    0 |
|---|---|---|---|---|---|---|
| symbol 5 | symbol 4 | symbol 3 | symbol 2 | symbol 1 | symbol 0 | valid number |
|  |  |  |  |  | symbol 0 | $3'b001$ |
|  |  |  |  | symbol 1 | symbol 0 | $3'b010$ |
|  |  |  | symbol 2 | symbol 1 | symbol 0 | $3'b011$ |
|  |  | symbol 3 | symbol 2 | symbol 1 | symbol 0 | $3'b100$ |
| symbol 5 | symbol 4 | symbol 3 | symbol 2 | symbol 1 | symbol 0 | $3'b101$ |

---

Algorithm 2: Update the codewords

```
 1  Function Updating(oldCodebook) is
 2      D ← emptydictionary;
 3      UpdatedCodebook ← emptydictionary;
 4      // count the frequency
 5      for codeIdx ← 0 to numberofcodewords do
 6          if codeIdx ∈ keys(D) then
 7              │   D[codeIdx] ← D[codeIdx] +1;
 8          else
 9              │   D[codeIdx] ← 1;
10          end
11      end
12      // sort the counter array
13      Sort(values(D));
14      // remapping the codewords
15      for i ← 0 to size of keys(D) do
16          │   UpdatedCodebook[i] ← oldCodebook[keys(D)[i]];
17      end
18  end
```

Figure 13:
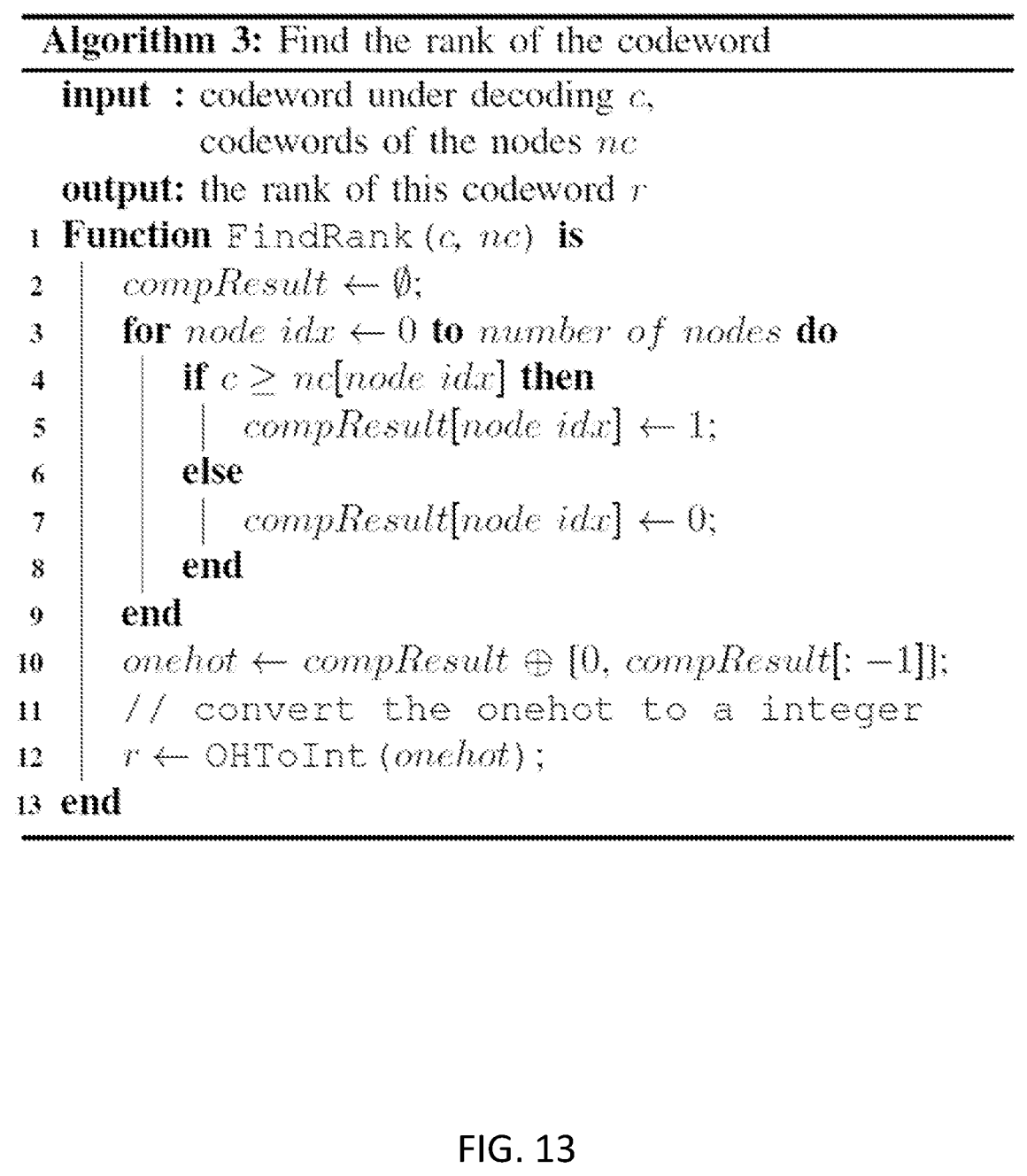

Algorithm 3: Find the rank of the codeword

--- input : codeword under decoding $c$,
codewords of the nodes $nc$ output: the rank of this codeword $r$

1 Function FindRank($c$, $nc$) is
2      $compResult \leftarrow \emptyset$;
3      for $node\ idx \leftarrow 0$ to $number\ of\ nodes$ do
4          if $c \geq nc[node\ idx]$ then
5              $compResult[node\ idx] \leftarrow 1$;
6          else
7              $compResult[node\ idx] \leftarrow 0$;
8          end
9      end
10      $onehot \leftarrow compResult \oplus [0, compResult[: -1]]$;
11      // convert the onehot to a integer
12      $r \leftarrow$ OHToInt($onehot$);
13 end

Algorithm 4: decoding the symbols along the tunstall tree. *nc*: a array of the codewords of the nodes; *ns*: a array of Boolean values of whether the nodes are inner nodes; *na*: a array of node addresses; *ng*: a array of Boolean values of whether the nodes have descendants

```
  input : codeword under decoding c,
          depth of current nodes in the Tunstall tree d,
          address of the memory a
  output: A sequence of uncompressed symbols
1 Function Decoding(c, d, a) is
2 |   symbols ← ∅;
3 |   nc, ns, na, ng ← n[d][a];
4 |   curSyb ← FindRank(c, nc);
5 |   if current node has descendants then
6 |   |   a ← na[curSyb];
7 |   |   Decoding the symbol using the function
      |   |     Decoding(c, d + 1, a);
8 |   else
9 |   |   if current node has child nodes then
10 |  |   |   // cnc: current node's
      |   |   |      codeword
11 |  |   |   cnc ← nc[curSyb];
12 |  |   |   symbols ← c − cnc
13 |  |   else
14 |  |   |   current codeword has been decompressed
15 |  |   end
16 |  end
17 end
```

FIG. 15

| 14 | 13 | 10 | 9 | 0 |
|---|---|---|---|---|
| grand-tree | addr/sub-tree | | codeword | |

FIG. 16

TABLE II

THE RESOURCES UTILIZATION AND DECODING CYCLES OF MO
DECODERS WITH DIFFERENT MEMORY ENTRIES AND MEMORY TYPE

| Resources and Decoding Cycle | | Memory-Oriented Decoder Entires and Memory Type | | | |
|---|---|---|---|---|---|
| | | MO 1024 RAM | MO 1024 SRAM | MO 64 RAM | MO 64 SRAM |
| Resources* | LUT | 1,601 | 192 | 267 | 197 |
| | FF | 1 | 13 | 13 | 20 |
| | LUT RAM | 1,184 | 0 | 76 | 0 |
| | BRAM | 0 | 2 | 0 | 1 |
| | BUFG | 1 | 1 | 1 | 1 |
| Cycle | ResNet-50 | 4,565,527 | 10,764,540 | 9,131,054 | 12,212,460 |
| | MobileNet-v2 | 743,007 | 1,486,014 | 1,848,581 | 2,035,657 |

*The RTLs are generated by the Chisel codes, and synthesis by Vivado 2020.1 without optimization.

FIG. 19

TABLE III

THE RESOURCES UTILIZATION AND DECODING CYCLES OF LO DECODERS
WITH DIFFERENT NUMBER OF SUB-DECODERS AND MEMORY BANKS

| Resources and Decoding Cycle | | Logic-Oriented Decoder Entires and Memory Type | | | |
|---|---|---|---|---|---|
| | | LO 8 SD* 27 banks | LO 1 SD 27 banks | LO 8 SD 10 banks | LO 1 SD 10 banks |
| Resources** | LUT | 6,322 | 2,140 | 4,942 | 1,771 |
| | FF | 3,201 | 33 | 544 | 33 |
| | LUT RAM | 2,585 | 1,442 | 2,797 | 1,236 |
| | BUFG | 2 | 1 | 2 | 1 |
| Cycle | ResNet-50 | 8,621,733 | 26,099,734 | 8,711,905 | 26,184,337 |
| | MobileNet-v2 | 1,081,304 | 3,621,028 | 1,177,903 | 3,655,032 |

* Sub-Decoder
**The RTLs are generated by the Chisel codes, and synthesis by Vivado 2020.1 without optimization.

FIG. 20

TABLE IV

THE CAPACITY OF THE MAIN MEMORY AND ESTIMATED MEMORY ACCESS POWER IN DIFFERENT METHODS

| CNN Architectures | Methods | Memory Capacity Requirements (Bytes, including the codebook) | | | Estimated Power Consumption (pJ) |
|---|---|---|---|---|---|
| | | maximum | average | minimum | |
| ResNet-50 | full precision (32-bit) | 11,180,732.0 | 2,308,203.7 | 26,188.0 | 1,707,645,000.0 |
| | Quantized 8-bit | 2,795,183.0 | 527,050.9 | 5,047.0 | 426,911,250.0 |
| | Quantized 4-bit | 1,397,591.5 | 263,525.5 | 2,523.5 | 213,455,625.0 |
| | Quantized 4-bit with Tunstall LO decoder | 565,622.7 | 113,640.9 | 4,733.8 | 46,895,720.0 |
| | Quantized 4-bit with Tunstall MO decoder | 571,026.7 | 119,114.5 | 16,942.6 | 16,266,349.2 |
| | Quantized 4-bit with Huffman coding | 521,362.3 | 108,522.5 | 3,520.9 | 17,412,582.0 |
| MobileNet-v2 | full precision (32-bit) | 5,756,796.0 | 270,116.0 | 1,124.0 | 214,742,230.9 |
| | Quantized 8-bit | 1,439,199.0 | 67,529.0 | 281.0 | 53,640,555.0 |
| | Quantized 4-bit | 719,599.5 | 33,764.5 | 140.5 | 26,842,770.0 |
| | Quantized 4-bit with Tunstall LO decoder | 260,755.8 | 17,936.5 | 490.0 | 7,146,345.2 |
| | Quantized 4-bit with Tunstall MO decoder | 265,611.3 | 23,877.6 | 6,540.0 | 3,902,169.6 |
| | Quantized 4-bit with Huffman coding | 263,962.3 | 17,549.4 | 268.4 | 2,576,045.4 |

FIG. 22

TABLE V

MEMORY ACCESS CYCLES IN DIFFERENT METHODS

| CNN Architectures | Methods | Weights Read Clock Cycle | | |
|---|---|---|---|---|
| | | maximum | average | minimum |
| ResNet-50 | off-chip DRAM | 8,385,549 | 1,581,153 | 15,141 |
| | on-chip MRAM | 2,795,183 | 527,051 | 5,047 |
| | Quantized 4-bit with Tunstall LO decoder | 1,084,854 | 159,833 | 4,146 |
| | Quantized 4-bit with Tunstall MO decoder | 424,494 | 85,568 | 4,442 |
| | Quantized 4-bit with Huffman coding | 4,170,894 | 868,124 | 27,753 |
| MobileNet-v2 | off-chip DRAM | 4,317,597 | 202,587 | 843 |
| | on-chip MRAM | 1,439,199 | 67,529 | 281 |
| | Quantized 4-bit with Tunstall LO decoder | 226,658 | 14,537 | 218 |
| | Quantized 4-bit with Tunstall MO decoder | 208,397 | 15,036 | 1,216 |
| | Quantized 4-bit with Huffman coding | 2,111,695 | 140,333 | 1,847 |

FIG. 23

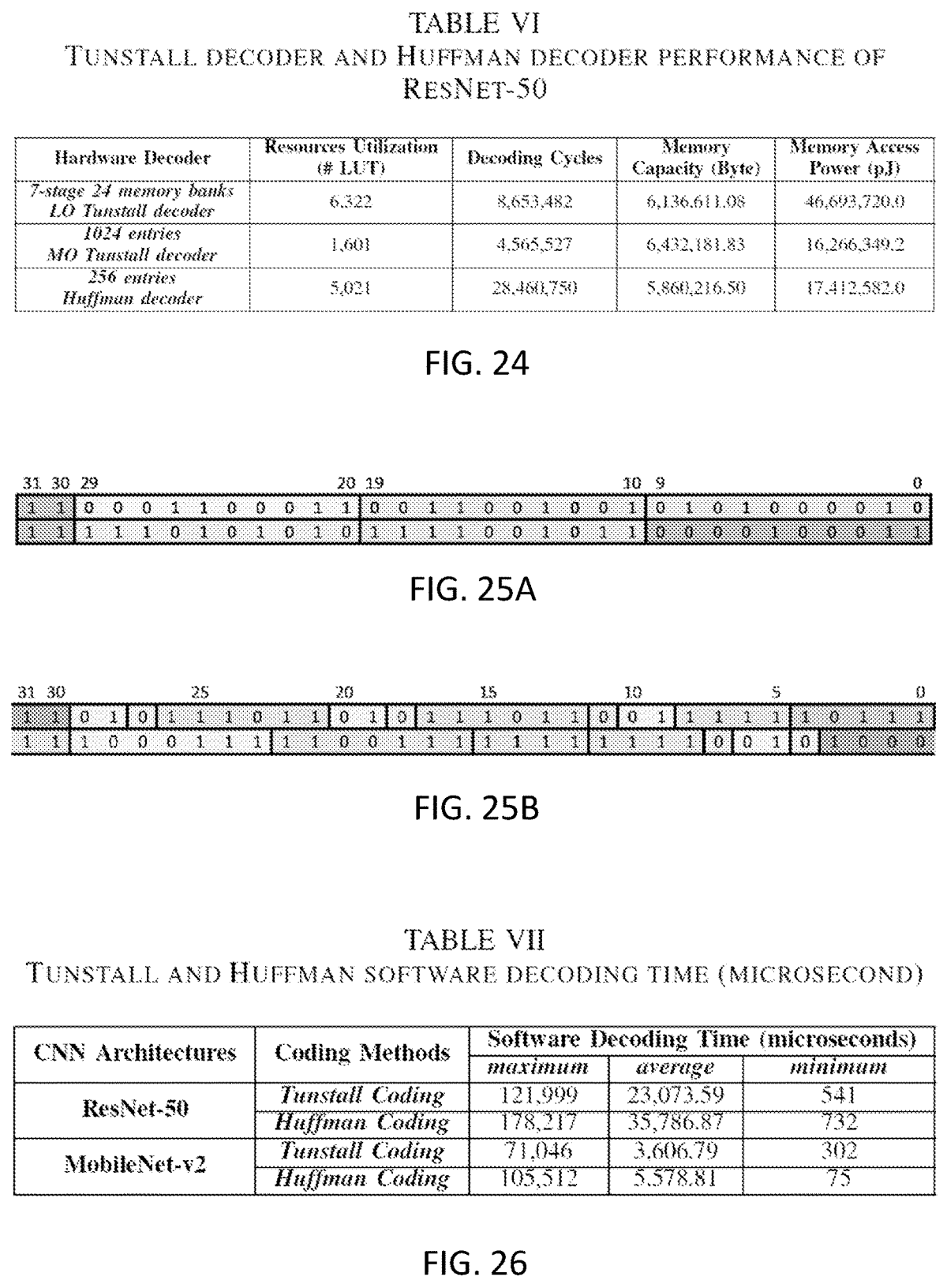

TABLE VI

TUNSTALL DECODER AND HUFFMAN DECODER PERFORMANCE OF
RESNET-50

| Hardware Decoder | Resources Utilization (# LUT) | Decoding Cycles | Memory Capacity (Byte) | Memory Access Power (pJ) |
|---|---|---|---|---|
| 7-stage 24 memory banks LO Tunstall decoder | 6,322 | 8,653,482 | 6,136,611.08 | 46,693,720.0 |
| 1024 entries MO Tunstall decoder | 1,601 | 4,565,527 | 6,432,181.83 | 16,266,349.2 |
| 256 entries Huffman decoder | 5,021 | 28,460,750 | 5,860,216.50 | 17,412,582.0 |

TABLE VII

TUNSTALL AND HUFFMAN SOFTWARE DECODING TIME (MICROSECOND)

| CNN Architectures | Coding Methods | Software Decoding Time (microseconds) | | |
|---|---|---|---|---|
| | | maximum | average | minimum |
| ResNet-50 | Tunstall Coding | 121,999 | 23,073.59 | 541 |
| | Huffman Coding | 178,217 | 35,786.87 | 732 |
| MobileNet-v2 | Tunstall Coding | 71,046 | 3,606.79 | 302 |
| | Huffman Coding | 105,512 | 5,578.81 | 75 |

FIG. 26

DECODERS FOR DECODING A CODEWORD OF A TUNSTALL CODE

CROSS-REFERENCE TO RELATED APPLICATIONS

The present application is a national phase entry of International Application No. PCT/SG2022/050887, filed Dec. 6, 2022, which claims priority to Singapore Patent Application No. 10202113561S, which are incorporated herein by reference in their entirety.

TECHNICAL FIELD

The present invention generally relates to decoders for decoding a codeword of a Tunstall code, which may be referred to as Tunstall decoders.

BACKGROUND

In the Artificial Intelligence of Things (AIoT) era, an increasing number of edge devices are required to be ultra-low power and the area of their chips are limited. Meanwhile, certain on-chip data, for example, weights of a neural network (e.g., deep learning neural network), also requires a larger memory (which usually occupies a large area) in order to fit a more complex and larger neural network model. Accordingly, in such a situation, data may be compressed at a sender or producer and decompressed at a receiver or consumer to save on both chip area and circuit power consumption.

For example, deep learning has been widely used in numerous Artificial Intelligence (AI) areas. In particular, Deep Neural Networks (DNNs) provide state-of-the-art accuracy for various applications. To obtain higher accuracy, DNNs may have significantly more parameters, which in turn increase energy consumption and memory requirements to store weights, in particular, for inference. These challenges become more prominent for resource constraint devices such as, but not limited to, battery-operated edge platforms.

In an attempt to address these challenges, existing works have explored three areas, namely, pruning, quantization, and entropy coding, to compress deep neural networks. In general, pruning removes weights and corresponding computations that have minimal or no impact on accuracy. In this regard, there have been disclosed techniques including channel, filter, connection and layer pruning. However, these techniques may require manual intervention for certain network layers to achieve better results. For example, there have been disclosed DNN hardware accelerators referred to as EIE (Efficient Inference Engine) and Eyeriss-v2, which adopted sparse representations to compress the pruned weights. However, the sparse representations are complicated for implementation, require specific hardware to support and may cause longer execution time.

Quantization is a method which may be applied to compress DNNs by decreasing the number of bits per variable for both weights and activations. For example, state-of-the-art quantization methods may compress weights down to 4 bits from 8 bits without losing accuracy. However, further reduction of the number of bits, for example compressing to 2 bits, can result in a noticeable accuracy drop.

Entropy coding focuses on encoding quantized values of weights (or activations) in a more compact representation by utilizing the peaky distribution of the quantized values to achieve a lower number of bits per variable. In practice, for example, if the number of bits per weight can be reduced from 4 bits to 2 bits, memory capacity requirements, as well as corresponding memory-access energy, can be significantly reduced, while simultaneously achieving significant inference speedup. Unlike pruning or quantization, entropy coding does not rely on training data to learn the codec and can encode and decode the quantized values without the need of re-training. As both encoding and decoding are lossless, using entropy coding does not cause any accuracy drop.

Although several previous works have adopted entropy coding, these previous works adopted Fixed-to-Variable (F2V) coding methods, such as arithmetic coding and Huffman coding. For example, in Deep Compression and Coreset-based Compression, Huffman coding was used to compress the quantized weights. However, the decoding stage of F2V coding methods is expensive, for example, because the encoded string need to be processed bit-by-bit which is not efficient. Moreover, it is difficult to develop a parallel implementation for the decoding stage, since the codewords in F2V coding methods have variable length and cannot be indexed. As a result, decoding multiple symbols per single clock cycle cannot be achieved. Therefore, F2V coding methods have very high computational complexity for decoding. For example, given the number of codewords (quantized values) n and the reciprocal of compression ratio k, the decoding complexity is as much as $O(n \cdot k)$. Unlike the encoding stage which can be performed offline, the decoding stage may need to be processed online. Accordingly, in real-time applications, if decoding is not efficient, it can significantly slow down the inference speed.

A need therefore exists to provide decoders, that seek to overcome, or at least ameliorate, one or more deficiencies in conventional decoders, and more particularly, to improve decoding efficiency, for example, such that memory capacity requirement and energy consumption on devices (in particular, resource constraint devices) can be reduced. It is against this background that the present invention has been developed.

SUMMARY

According to a first aspect of the present invention, there is provided a decoder for decoding a codeword of a Tunstall code, the decoder comprising:

a sub-decoder configured to receive an input codeword of the Tunstall code to the decoder and output a decoded symbol of the input codeword;

a symbol memory configured to receive and store the decoded symbol of the input codeword from the sub-decoder; and a controller configured to control the symbol memory to output one or more decoded symbols stored in the symbol memory, wherein the sub-decoder comprises:

a node memory configured to store, for a plurality of nodes of a Tunstall tree of the Tunstall code corresponding to a first level of the Tunstall tree, a plurality of codewords of the Tunstall code assigned to the plurality of nodes, respectively; and a comparator configured to compare the input codeword with the plurality of codewords assigned to the plurality of nodes corresponding to the first level of the Tunstall tree received from the node memory and produce the decoded symbol of the input codeword with respect to the first level of the Tunstall tree based on the comparison.

According to a second aspect of the present invention, there is provided a method of operating the decoder for decoding a codeword of a Tunstall code according to the above-mentioned first aspect of the present invention, the method comprising:

receiving, by the sub-decoder of the decoder, an input codeword of the Tunstall code to the decoder;

outputting, by the sub-decoder, a decoded symbol of the input codeword;

receiving and storing, by the symbol memory of the decoder, the decoded symbol of the input codeword from the sub-decoder; and controlling, by the controller of the decoder, the symbol memory to output one or more decoded symbols stored in the symbol memory, wherein the method further comprises comparing, by the comparator of the sub-decoder, the input codeword with the plurality of codewords assigned to the plurality of nodes corresponding to the first level of the Tunstall tree received from the node memory of the sub-decoder and producing, by the comparator, the decoded symbol of the input codeword with respect to the first level of the Tunstall tree based on the comparison.

According to a third aspect of the present invention, there is provided a decoder for decoding a codeword of a Tunstall code, the decoder comprising:

a symbol memory comprising a plurality of memory entries, each memory entry having stored therein one or more decoded symbols of a codeword of the Tunstall code corresponding to the memory entry; and a controller configured to receive an input codeword of the Tunstall code to the decoder and control the symbol memory to output the one or more decoded symbols stored in one of the plurality of memory entries corresponding to the input codeword.

According to a fourth aspect of the present invention, there is provided a method of operating the decoder for decoding a codeword of a Tunstall code according to the above-mentioned third aspect of the present invention, the method comprising:

receiving, by the controller of the decoder, an input codeword of the Tunstall code; and controlling, by the controller of the decoder, the symbol memory of the decoder to output one or more decoded symbols stored in one of the plurality of memory entries corresponding to the input codeword.

BRIEF DESCRIPTION OF THE DRAWINGS

Embodiments of the present invention will be better understood and readily apparent to one of ordinary skill in the art from the following written description, by way of example only, and in conjunction with the drawings, in which:

FIG. 3 depicts a schematic flow diagram of a method of operating the decoder for decoding a codeword of a Tunstall code according to various first embodiments of the present invention;

FIG. 4 depicts a schematic flow diagram of a method of operating the decoder for decoding a codeword of a Tunstall code according to various second embodiments of the present invention;

FIGS. 5A to 5C depict an example construction of a Tunstall tree;

FIG. 6 depicts a table (Table I) showing a codebook of the example 3-bit Tunstall tree shown in FIGS. 5A to 5C;

FIG. 8 shows an example algorithm (Algorithm 1) for implementing the MO decoding method according to various first example embodiments of the present invention;

FIG. 11A depicts an example method or algorithm (Algorithm 2) for updating the decoded symbol(s) of corresponding codewords stored in the on-chip memory according to various first example embodiments of the present invention;

FIG. 13 depicts an example method or algorithm (Algorithm 3) for determining the rank of a selected node for a level of a Tunstall tree according to various second example embodiments of the present invention;

FIG. 15 shows an example algorithm (Algorithm 4) for implementing the MO decoding method according to various second example embodiments of the present invention;

FIG. 16 depicts an example data format for information associated with a node according to various second example embodiments of the present invention;

FIG. 19 depicts a table (Table II) showing the resources utilization and decoding cycles of MO decoders with different memory entries and memory type;

FIG. 20 depicts a table (Table III) showing the resources utilization and decoding cycles of LO decoders with different number of sub-decoders and memory banks;

FIG. 22 depicts a table (Table IV) summarizing the capacity of the main memory and estimated memory access power in different methods;

FIG. 23 depicts a table (Table V) showing memory access cycles in different methods;

FIG. 24 depicts a Table (Table VI) showing the performance of the above-mentioned LO Tunstall decoder and MO Tunstall decoder for ResNet-50;

FIGS. 25A and 25B show two examples Tunstall and Huffman codewords, respectively, stored in two 32-bit main memory cells; and FIG. 26 depicts a table (Table VII) showing the Tunstall and Huffman software decoding time.

DETAILED DESCRIPTION

Various embodiments of the present invention provide decoders for decoding a codeword of a Tunstall code, which may be referred to as Tunstall decoders.

In particular, various embodiments of the present invention advantageously provide a Variable-to-Fixed (V2F) entropy coding method, namely, Tunstall coding, to compress data. In various embodiments, Tunstall coding is utilized to compress quantized weights of neural networks. For example, various embodiments found that Tunstall coding can achieve very high compression ratio on various deep networks. Moreover, the decoding of Tunstall coding according to various embodiments of the present invention is much more efficient than the F2V decoding. For example, as Tunstall coding encodes multiple symbols into a fixed length of bits, in the decoding stage, multiple bits can be processed simultaneously (i.e., in parallel). Therefore, various embodiments found that the decoding of Tunstall coding is much faster. Furthermore, various embodiments note that the decoding complexity in Tunstall coding can be only O(n), which is much less than that in the F2V coding methods (as much as O(n·k) as explained in the background). Accordingly, various embodiments of the present invention advantageously provide a V2F entropy coding method, namely, Tunstall coding, to improve decoding efficiency, such as for deep network compression, as well as hardware implementations for Tunstall decoding. In particular, various embodiments of the present invention advantageously provide decoders, and more particularly, Tunstall decoders, that seek to overcome, or at least ameliorate, one or more deficiencies in conventional decoders, and more particularly, to improve decoding efficiency, for example, such that memory capacity requirement and energy consumption on devices (in particular, resource constraint devices) can be reduced.

Figure 1:
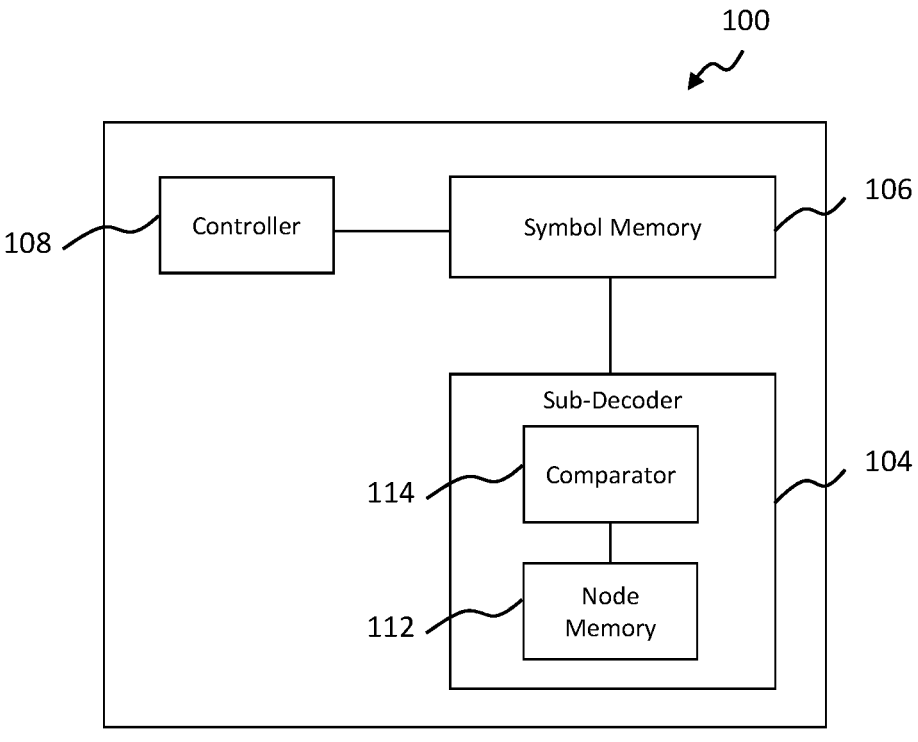
FIG. 1 depicts a schematic block diagram of a decoder for decoding a codeword of a Tunstall code according to various first embodiments of the present invention.

FIG. 1 depicts a schematic block diagram of a decoder 100 for decoding a codeword of a Tunstall code according to various first embodiments of the present invention. The decoder 100 comprises: a sub-decoder 104 (or a sub-decoder circuit or module) configured to receive an input codeword of the Tunstall code to the decoder 100 and output a decoded symbol of the input codeword; a symbol memory 106 configured to receive and store the decoded symbol of the input codeword from the sub-decoder 104; and a controller 108 (or a controller circuit or module) configured to control the symbol memory 106 to output one or more decoded symbols stored in the symbol memory 106. The sub-decoder 104 comprises: a node memory 112 configured to store (or has stored therein), for a plurality of nodes of a Tunstall tree of the Tunstall code corresponding to a first level of the Tunstall tree, a plurality of codewords of the Tunstall code assigned to the plurality of nodes, respectively; and a comparator 114 (or a comparator circuit or module) configured to compare the input codeword with the plurality of codewords assigned to the plurality of nodes corresponding to the first level of the Tunstall tree received from the node memory 112 and produce the decoded symbol of the input codeword with respect to the first level of the Tunstall tree based on the comparison.

In various first embodiments, the above-mentioned produce the decoded symbol of the input codeword with respect to the first level of the Tunstall tree comprises: determining one of the plurality of nodes corresponding to the first level of the Tunstall tree as a determined node for the first level of the Tunstall tree based on the comparison; and producing the decoded symbol of the input codeword with respect to the first level of the Tunstall tree based on the determined node.

In various first embodiments, the sub-decoder 104 is further configured to: determine whether the determined node for the first level of the Tunstall tree has associated therewith a descendant node, the descendant node being two levels down from the determined node according to the Tunstall tree; and obtain an address (e.g., a start address) of a plurality of nodes of the Tunstall tree corresponding to a next level (immediately next or subsequent level) of the Tunstall tree with respect to the first level of the Tunstall tree based on determining that (i.e., if it is determined that) the determined node for the first level of the Tunstall tree has associated therewith the descendent node.

In various first embodiments, the sub-decoder 104 further comprises a selector (or a selector circuit or module) communicatively coupled to the comparator 114 and the node memory 112 and configured to perform the above-mentioned determine whether the determined node for the first level of the Tunstall tree has associated therewith the descendant node and the above-mentioned obtain the address of the plurality of nodes of the Tunstall tree corresponding to the next level of the Tunstall tree.

In various first embodiments, according to a first example configuration or architecture, the decoder 100 further comprises one or more additional sub-decoders (or additional sub-decoder circuits or modules). For example, the above-mentioned sub-decoder 104 and the one or more additional sub-decoders may thus form a series of pipeline stages for decoding the input codeword. In this regard, the sub-decoder 104 is a first sub-decoder is associated with the first level of the Tunstall tree (e.g., the level immediately after the root of the Tunstall tree), and the one or more additional sub-decoders are associated with one or more additional levels of the Tunstall tree, respectively.

In various first embodiments, according to the first example configuration or architecture, each of the one or more additional sub-decoders is configured to receive the input codeword and output a decoded symbol of the input codeword with respect to the level of the Tunstall tree associated with the additional sub-decoders and comprises: a node memory configured to store (or has stored therein), for a plurality of nodes of the Tunstall tree of the Tunstall code corresponding to the level of the Tunstall tree associated with the additional sub-decoder, a plurality of codewords of the Tunstall code assigned to the plurality of nodes, respectively; and a comparator configured to compare the input codeword with the plurality of codewords assigned to the plurality of nodes corresponding to the level of the Tunstall tree associated with the additional sub-decoder received from the node memory and produce a decoded symbol of the input codeword with respect to the level of the Tunstall tree associated with the additional sub-decoder based on the comparison.

In various first embodiments, according to the first example configuration or architecture, the above-mentioned produce the decoded symbol of the input codeword with respect to the level of the Tunstall tree associated with the additional sub-decoder comprises: determining one of the plurality of nodes corresponding to the level of the Tunstall tree as a determined node for the level of the Tunstall tree based on the comparison; and producing the decoded symbol of the input codeword with respect to the level of the Tunstall tree associated with the additional sub-decoder based on the determined node.

In various first embodiments, according to the first example configuration or architecture, the first sub-decoder 104 is configured to, based on determining that (i.e., if it is determined that) the determined node for the first level of the Tunstall tree associated with the first sub-decoder 104 has associated therewith the descendent node, output the address of the plurality of nodes corresponding to the next level of the Tunstall tree with respect to the first level of the Tunstall tree to an additional sub-decoder of the one or more additional sub-decoders associated with the next level of the Tunstall tree for the comparator of the additional sub-decoder to compare the input codeword with the plurality of codewords assigned to the plurality of nodes corresponding to the next level of the Tunstall tree received from the node memory of the additional sub-decoder based on the address of the plurality of nodes received and produce the decoded symbol of the input codeword with respect to the next level of the Tunstall tree associated with the additional sub-decoder based on the comparison. In this regard, the additional sub-decoder is further configured to output the decoded symbol of the input codeword with respect to the next level of the Tunstall tree associated with the additional sub-decoder to the symbol memory 106.

In various first embodiments, according to the first example configuration or architecture, each additional sub-decoder of the one or more additional sub-decoders is configured to, based on determining that the determined node for the level of the Tunstall tree associated with the additional sub-decoder has associated therewith the descendent node, output an address of the plurality of nodes corresponding to a next level of the Tunstall tree with respect to the level of the Tunstall tree to another additional sub-decoder associated with the next level of the Tunstall tree for the comparator of said another additional sub-decoder to compare the input codeword with the plurality of codewords assigned to the plurality of nodes corresponding to the next level of the Tunstall tree received from the node memory of said another additional sub-decoder based on the address of the plurality of nodes received and produce the decoded symbol of the input codeword with respect to the next level of the Tunstall tree based on the comparison. In this regard, said another additional sub-decoder is further configured to output the decoded symbol of the input codeword with respect to the next level of the Tunstall tree to the symbol memory.

Accordingly, in the same or similar manner as the sub-decoder 104, each additional sub-decoder may also further comprise a selector (or a selector circuit or module) communicatively coupled to the comparator and the node memory of the additional sub-decoder and configured to determine whether the determined node for the level of the Tunstall tree associated with the additional sub-decoder has associated therewith a descendant node and configured to obtain the above-mentioned address of the plurality of nodes corresponding to the next level of the Tunstall tree with respect to the level of the Tunstall tree.

In various first embodiments, according to the first example configuration or architecture, each sub-decoder of the first sub-decoder 104 and the one or more additional sub-decoders is configured to, based on determining that the determined node for the level of the Tunstall tree associated with the sub-decoder does not have associated therewith the descendent node, determine (e.g., by the selector of the sub-decoder) whether the determined node for the level of the Tunstall tree associated with the sub-decoder has associated therewith a child node, wherein the child node is one level down from the determined node according to the Tunstall tree. In this regard, the decoder 100 further comprises a subtractor (or a subtractor circuit or module) configured to, based on the sub-decoder determining that the determined node for the level of the Tunstall tree associated with the sub-decoder has associated therewith the child node, produce a decoded symbol of the input codeword with respect to a next level of the Tunstall tree with respect to the level of the Tunstall tree based on the input codeword and the codeword assigned to the determined node for the level of the Tunstall tree associated with the sub-decoder.

In various first embodiments, according to a second example configuration or architecture, the node memory 112 of the sub-decoder 104 is configured to store (or has stored therein), for each level of a plurality of levels of the Tunstall tree, including the above-mentioned first level of the Tunstall tree, and for a plurality of nodes of the Tunstall tree corresponding to the level of the Tunstall tree, a plurality of codewords of the Tunstall code assigned to the plurality of nodes corresponding to the level of the Tunstall tree, respectively. That is, the node memory 112 is configured to store (or has stored therein) a plurality of codewords assigned to the plurality of nodes for a plurality of levels of the Tunstall tree.

In various first embodiments, according to the second example configuration or architecture, the comparator 114 is configured to, based on the sub-decoder 104 determining that (e.g., determined by the selector of the sub-decoder 104) the determined node for a level of the Tunstall tree has associated therewith the descendent node: compare the input codeword with the plurality of codewords assigned to the plurality of nodes of the Tunstall tree corresponding to a next level (immediately next or subsequent level) of the Tunstall tree with respect to the level of the Tunstall tree received from the node memory 112 based on an address of the plurality of nodes of the Tunstall tree corresponding to the next level of the Tunstall tree; determine one of the plurality of nodes corresponding to the next level of the Tunstall tree as a determined node for the next level of the Tunstall tree based on the comparison; and produce a decoded symbol of the input codeword with respect to the next level of the Tunstall tree based on the determined node for the next level of the Tunstall tree. In this regard, the sub-decoder 104 is further configured to output the decoded symbol of the input codeword with respect to the next level of the Tunstall tree to the symbol memory 106.

In various first embodiments, according to the second example configuration or architecture, the sub-decoder 104 is further configured to, based on determining that the determined node for a level of the Tunstall tree does not have associated therewith the descendent node, determine (e.g., by the selector of the sub-decoder 104) whether the determined node for the level of the Tunstall tree has associated therewith a child node, wherein the child node is one level down from the determined node according to the Tunstall tree. In this regard, the decoder 100 further comprises a subtractor configured to, based on the sub-decoder 104 determining that the determined node for the level of the Tunstall tree has associated therewith the child node, produce a decoded symbol of the input codeword with respect to a next level of the Tunstall tree with respect to the level of the Tunstall tree based on the input codeword and the codeword assigned to the determined node for the level of the Tunstall tree.

In various first embodiments, the symbol memory 106 comprises a plurality of memory banks, each memory bank being configured to store one or more decoded symbols of a corresponding codeword. In this regard, the controller 108 is configured to control the symbol memory 106 to output, for each of the plurality of memory banks, the one or more decoded symbols of the corresponding codeword stored in the memory bank.

In various first embodiments, the input codeword corresponds to compressed quantized weights of a neural network. In this regard, the one or more decoded symbols of the input codeword stored in the symbol memory 106 and output from the decoder 100 correspond to uncompressed quantized weights of the neural network.

In various first embodiments, the decoder 100 is an integrated circuit. In various first embodiments, the controller 108 and the sub-decoder 104 (as well as each additional sub-decoder if any) are communicatively coupled to the symbol memory 106. In various first embodiments, the controller 108 is also communicatively coupled to the sub-decoder 104 (as well as each additional sub-decoder if any).

Figure 2:
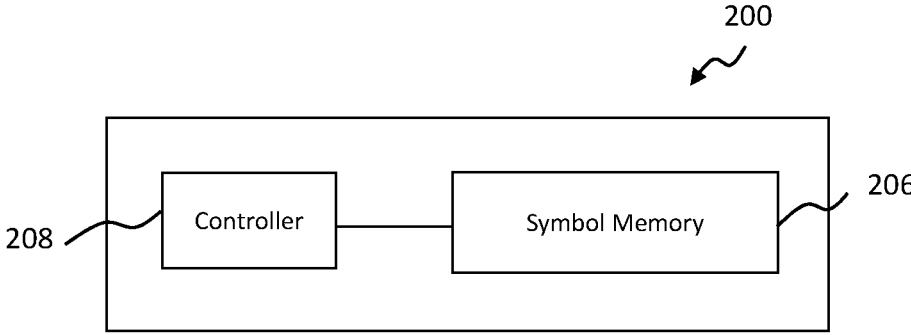
FIG. 2 depicts a schematic block diagram of a decoder for decoding a codeword of a Tunstall code according to various second embodiments of the present invention.

FIG. 2 depicts a schematic block diagram of a decoder 200 for decoding a codeword of a Tunstall code according to various second embodiments of the present invention. The decoder 200 comprises: a symbol memory 206 comprising a plurality of memory entries, each memory entry having stored therein one or more decoded symbols of a codeword of the Tunstall code corresponding to the memory entry; and a controller 208 (or a controller circuit or module) configured to receive an input codeword of the Tunstall code to the decoder 200 and control the symbol memory 206 to output the one or more decoded symbols stored in one of the plurality of memory entries corresponding to the input codeword. It will be understood by a person skilled in the art that, unless stated or context requires otherwise, one or more decoded symbols of a codeword refers to all decoded symbol(s) of the codeword whereby the number of decoded symbols of the codeword may be one or more.

In various second embodiments, the above-mentioned control the symbol memory 206 to output the one or more decoded symbols stored in one of the plurality of memory entries corresponding to the input codeword is based on the input codeword functioning (or serving) as an address to the above-mentioned one of the plurality of memory entries.

In various second embodiments, the symbol memory 206 is an on-chip memory. In this regard, the controller 208 is communicatively coupled to the symbol memory 206 and an off-chip memory, wherein the plurality of memory entries of the symbol memory 206 have stored therein the one or more decoded symbols of a first plurality of codewords of the Tunstall code, respectively, and the off-chip memory has stored therein, for each of a second plurality of codewords of the Tunstall code, one or more decoded symbols of the codeword. In this regard, the controller 208 is configured to determine whether the one or more decoded symbols of the input codeword is located in the symbol memory 206 or the off-chip memory, and control the determined one of the symbol memory 206 and the off-chip memory to output the one or more decoded symbols of the input codeword.

In various second embodiments, the plurality of memory entries of the symbol memory are updated with one or more decoded symbols of a plurality of remapped codewords, respectively, the plurality of remapped codewords being at a plurality of codebook entries of an updated codebook replacing a plurality of codewords previously thereat having highest frequency counts. Accordingly, the above-mentioned first plurality of codewords correspond to the plurality of remapped codeword.

In various second embodiments, each of the plurality of memory entries of the symbol memory 106 has further stored therein a symbol number parameter indicating the number of decoded symbols of a corresponding codeword stored in the memory entry.

In various second embodiments, the input codeword corresponds to compressed quantized weights of a neural network. In this regard, the one or more decoded symbols stored in each of the plurality of memory entries of the symbol memory and the one or more decoded symbols of the input codeword output from the decoder correspond to uncompressed quantized weights of the neural network.

In various second embodiments, the decoder 200 is an integrated circuit. In various second embodiments, the controller 208 is communicatively coupled to the symbol memory 206.

FIG. 3 depicts a schematic flow diagram of a method 300 of operating the decoder 100 for decoding a codeword of a Tunstall code according to various first embodiments of the present invention. The method 300 comprises: receiving (at 302), by the sub-decoder 104 of the decoder 100, an input codeword of the Tunstall code to the decoder 100; outputting (at 304), by the sub-decoder 104, a decoded symbol of the input codeword; receiving and storing (at 306), by the symbol memory 106 of the decoder 100, the decoded symbol of the input codeword from the sub-decoder 104; and controlling (at 308), by the controller 108 of the decoder 100, the symbol memory 106 to output one or more decoded symbols stored in the symbol memory 106. Furthermore, in relation to the above-mentioned outputting (at 304) the decoded symbol of the input codeword, the method 300 further comprises comparing, by the comparator 114 of the sub-decoder 104, the input codeword with the plurality of codewords assigned to the plurality of nodes corresponding to the first level of the Tunstall tree received from the node memory 112 of the sub-decoder 104 and producing, by the comparator 114, the decoded symbol of the input codeword with respect to the first level of the Tunstall tree based on the comparison.

It will be appreciated by a person skilled in the art that various operations of the method 300 correspond to various functions or operations configured to be performed by the decoder 100 as described herein according to various embodiments (or various example embodiments), and thus need not be repeated with respect to the method 300 of operating the decoder 100 for clarity and conciseness. In other words, various embodiments described herein in the context of functions or operations of the decoder 100 are analogously valid for the corresponding method 300 of operating the decoder 100.

FIG. 4 depicts a schematic flow diagram of a method 400 of operating the decoder 200 for decoding a codeword of a Tunstall code according to various second embodiments of the present invention. The method 400 comprises: receiving (at 402), by the controller 208 of the decoder 200, an input codeword of the Tunstall code; and controlling (404), by the controller 208 of the decoder 200, the symbol memory 206 of the decoder 200 to output one or more decoded symbols stored in one of the plurality of memory entries corresponding to the input codeword.

Similarly, it will be appreciated by a person skilled in the art that various operations of the method 400 correspond to various functions or operations configured to be performed by the decoder 200 as described herein according to various embodiments (or various example embodiments), and thus need not be repeated with respect to the method 400 of operating the decoder 200 for clarity and conciseness. In other words, various embodiments described herein in the context of functions or operations of the decoder 200 are analogously valid for the corresponding method 400 of operating the decoder 200.

As described hereinbefore, the decoder 100 and the decoder 200 may be implemented or realized as an integrated circuit, such as but not limited to, a field-programmable gate array (FPGA).

A memory or computer-readable storage medium used in various embodiments (e.g., the symbol memory 106/206 and the node memory 112) may be a volatile memory, for example a DRAM (Dynamic Random Access Memory) or a non-volatile memory, for example a PROM (Programmable Read Only Memory), an EPROM (Erasable PROM), EEPROM (Electrically Erasable PROM), or a flash memory, e.g., a floating gate memory, a charge trapping memory, an MRAM (Magnetoresistive Random Access Memory) or a PCRAM (Phase Change Random Access Memory). A controller (or a processor) used in various embodiments may be any controller having processing capability for performing various functions or operations described herein.

A "circuit" can be understood as any kind of a logic implementing entity, which may be special purpose circuitry or a processor executing software stored in a memory, firmware, or any combination thereof. Thus, in various embodiments, a "circuit" may be a hard-wired logic circuit or a programmable logic circuit such as a programmable processor, e.g., a microprocessor (e.g., a Complex Instruction Set Computer (CISC) processor or a Reduced Instruction Set Computer (RISC) processor). A "circuit" may also be a processor executing software, e.g., any kind of computer program, e.g., a computer program using a virtual machine code, e.g., Java. Any other kind of implementation of the respective functions may also be understood as a "circuit" according to various embodiments.

Some portions of the present disclosure are explicitly or implicitly presented in terms of algorithms and functional or symbolic representations of operations on data within a computer memory. These algorithmic descriptions and functional or symbolic representations are the means used by those skilled in the data processing arts to convey most effectively the substance of their work to others skilled in the art. An algorithm is here, and generally, conceived to be a self-consistent sequence of steps leading to a desired result. The steps are those requiring physical manipulations of physical quantities, such as electrical, magnetic or optical signals capable of being stored, transferred, combined, compared, and otherwise manipulated.

Functional components or modules described herein according to various embodiments may be implemented as hardware components or modules. More particularly, in the hardware sense, a module is a functional hardware unit designed for use with other components or modules. For example, a module may be implemented using discrete electronic components, or it can form a portion of an entire electronic circuit such as an Application Specific Integrated Circuit (ASIC). Numerous other possibilities exist. It will be appreciated by a person skilled in the art that the terminology used herein is for the purpose of describing various embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Any reference to an element or a feature herein using a designation such as "first", "second" and so forth does not limit the quantity or order of such elements or features, unless stated or the context requires otherwise. For example, such designations may be used herein as a convenient way of distinguishing between two or more elements or instances of an element. Thus, a reference to first and second elements does not necessarily mean that only two elements can be employed, or that the first element must precede the second element. In addition, a phrase referring to "at least one of" a list of items refers to any single item therein or any combination of two or more items therein.

In order that the present invention may be readily understood and put into practical effect, various example embodiments of the present invention will be described hereinafter by way of examples only and not limitations. It will be appreciated by a person skilled in the art that the present invention may, however, be embodied in various different forms or configurations and should not be construed as limited to the example embodiments set forth hereinafter. Rather, these example embodiments are provided so that this disclosure will be thorough and complete, and will fully convey the scope of the present invention to those skilled in the art.

In particular, for better understanding of the present invention and without limitation or loss of generality, unless stated or the context requires otherwise, various example embodiments of the present invention will be described below with respect to codewords corresponding to compressed quantized weights of neural network(s). However, it will be understood by a person skilled in the art that the present invention is not limited to codewords being quantized weights of neural network(s), and may be, or represent, any type of data as long as compression or size reduction of the data is desired.

Data compression is the process of converting an input data stream into another output data stream having a smaller size. To keep the information in the input data, various example embodiments of the present invention apply entropy encoding. In general, entropy encoding is a lossless data compression scheme that is independent of the specific characteristics of the medium. In particular, various example embodiments of the present invention apply a Variable-to-Fixed (V2F) entropy method called Tunstall coding for encoding one or more symbols into one fixed width of codeword. During the decoding, for example, multiple symbols can be decoded simultaneously (i.e., in parallel), and hence can significantly increase decoding speed.

As an example practical application, various example embodiments provide efficient Tunstall decoders for deep neural network compression. For example, power and area-efficient deep neural network (DNN) designs are important in edge applications. Compact DNNs, via compression or quantization, enable such designs by significantly reducing memory accesses. Lossless entropy coding can further reduce the size of neural networks significantly. In this regard, various example embodiments provide hardware support for such an entropy coding module to fully benefit from the resulted reduced memory requirement. In particular, various example embodiments apply Tunstall coding to compress quantized weights of neural networks. In this regard, various example embodiments found that Tunstall coding can achieve high compression ratio. Moreover, the decoding of Tunstall coding according to various embodiments of the present invention can achieve a very fast decoding speed on various deep networks. Various example embodiments provide two hardware-accelerated decoding techniques that provide streamlined decoding capabilities. In this regard, various example embodiments synthesize these designs targeting on field-programmable gate array (FPGA). As will be discussed later below, experimental results show that up to 10× faster decoding speed can be achieved using decoders according to various example embodiments of the present invention compared with conventional or state-of-the-art decoders.

Accordingly, various example embodiments of the present invention advantageously provide a V2F entropy coding method, namely, Tunstall coding, to compress quantized weights of neural networks. For example, various example embodiments found that Tunstall coding can achieve very high compression ratio on various deep networks. Moreover, the decoding of Tunstall coding according to various embodiments of the present invention is much more efficient than the F2V decoding. For example, different from F2V coding methods, V2F coding methods (or more particularly, Tunstall coding) encodes multiple symbols into fixed number of bits. In the decoding stage, multiple bits can thus be processed simultaneously and decode multiple symbols per clock cycle, resulting in much faster decoding. For example, the encoded string may also be decoded in parallel since the encoded string can be split into fixed-length bit chucks based on the length of codewords. Furthermore, the decoding complexity in Tunstall coding is only O(n), which is much less than that in the F2V coding methods. Accordingly, various example embodiments adopt the V2F Tunstall coding method for its high compression ratio and low decoding complexity.

Various example embodiments of the present invention further develop hardware implementations for the decoding stage in Chisel and present two hardware accelerated decoding techniques, such as for deep neural networks. In this regard, various first example embodiments of the present invention provide a first decoding method (and a corresponding first decoder), which may be referred to as a memory-oriented (MO) decoding method (and the corresponding memory-oriented (MO) decoder) or a dictionary-based decoding method (and the corresponding dictionary-based decoder). This first decoding method or first decoder corresponds to the decoder 200 for decoding a codeword of a Tunstall code as described hereinbefore with reference to FIG. 2 according to various second embodiments of the present invention. Various second example embodiments of the present invention provide a second decoding method (and a corresponding second decoder), which may be referred to a logic-oriented (LO) decoding method (and the corresponding LO decoder) or a Tunstall tree-based decoding method (and the corresponding Tunstall tree-based decoder). This second decoding method or second decoder corresponds to the decoder 100 for decoding a codeword of a Tunstall code as described hereinbefore with reference to FIG. 1 according to various first embodiments of the present invention. In various example embodiments, the MO decoder and LO decoder are synthesized or implemented on FPGA. Accordingly, various example embodiments of the present invention advantageously:

adopt the V2F entropy coding method, namely, Tunstall coding, to address inefficient decoding problem in deep neural network compression; and provide two hardware implementations for the Tunstall decoding methods, namely, MO and LO decoder architectures.

As will be discussed later below, experimental results show that, by using the decoders according to various example embodiments of the present inventions, for example, the memory usage of the inference stage on deep networks, namely, ResNet-50 and MobileNetv2, can be reduced by 18× and 2.3× compared with the full precision 32-bit network and the quantized 4-bit network, respectively, while achieving up to 10× speedup than F2V decoders.

Tunstall Coding Overview

Construction of Tunstall Tree and Encoding

As an illustrative example, FIGS. 5A to 5C depict an example construction of a Tunstall tree. In this example, there are three symbols 'A', 'B' and 'C' with probabilities of 0.7, 0.18 and 0.12, respectively. A 3-bit Tunstall tree may thus be constructed to encode the symbols. Specifically, the construction of the Tunstall tree is performed in an iterative manner. At the beginning, the Tunstall tree has one single root with probability of 1.0. For each iteration, the leaf node with highest probability is selected and converted to a new subtree with K children nodes, where K is the total number of symbols (e.g., K=3 in this example). For example, at the second iteration illustrated in FIG. 5B, the leaf node associated with 'A', which has the largest probability of 0.7 (as shown in FIG. 5A), is selected and converted to a new subtree with children nodes associated with 'AA', 'AB' and 'AC', respectively. At the third iteration illustrated in FIG. 5C, the leaf node associated with 'AA', which has the largest probability of 0.49, is selected and converted to a new subtree with children nodes associated with 'AAA', 'AAB' and 'AAC', respectively. To complete the Tunstall tree, the iteration continues until the total number of leaf nodes reaches up to $2^C$ (i.e., equal to or as close to $2^C$ as possible but not exceeding $2^C$), where C is the fixed length of the Tunstall codewords (e.g., C=3 in this example).

FIG. 6 depicts a table (Table I) showing a codebook of the example 3-bit Tunstall tree shown in FIGS. 5A to 5C. For example, according to the codebook, the symbol sequence 'AAABAAC' is encoded into a binary string '000101010' (i.e., codewords '000', '101' and '010'), whereby symbols 'AAA' are encoded as codeword '000', symbol 'B' is encoded as codeword '101' and symbols 'AAC' are encoded as codeword '010'. Accordingly, as can be seen, one or more symbols are encoded into a fixed length codeword (e.g., 3-bit codeword in this example). Accordingly, a Tunstall code is constructed by a set of fixed-size codewords (e.g., a set of 3-bit Tunstall codes in this example), each encoding a variable-size string of input symbol(s).

Decoding

As the codewords of Tunstall coding have a fixed length, in the decoding stage, various example embodiments can process a codeword at a time and decode the codeword efficiently, such as by referring to the codebook. For example, if the fixed length of codewords is 8 bits, 8 bits may be processed each cycle. Accordingly, decoding methods according to various example embodiments can advantageously be byte-oriented and thus are much faster than the decoding of F2V coding methods which need to process the encoded string bit-by-bit.

Memory-Oriented (MO) Decoding

Decoding Method or Algorithm

Figure 7:
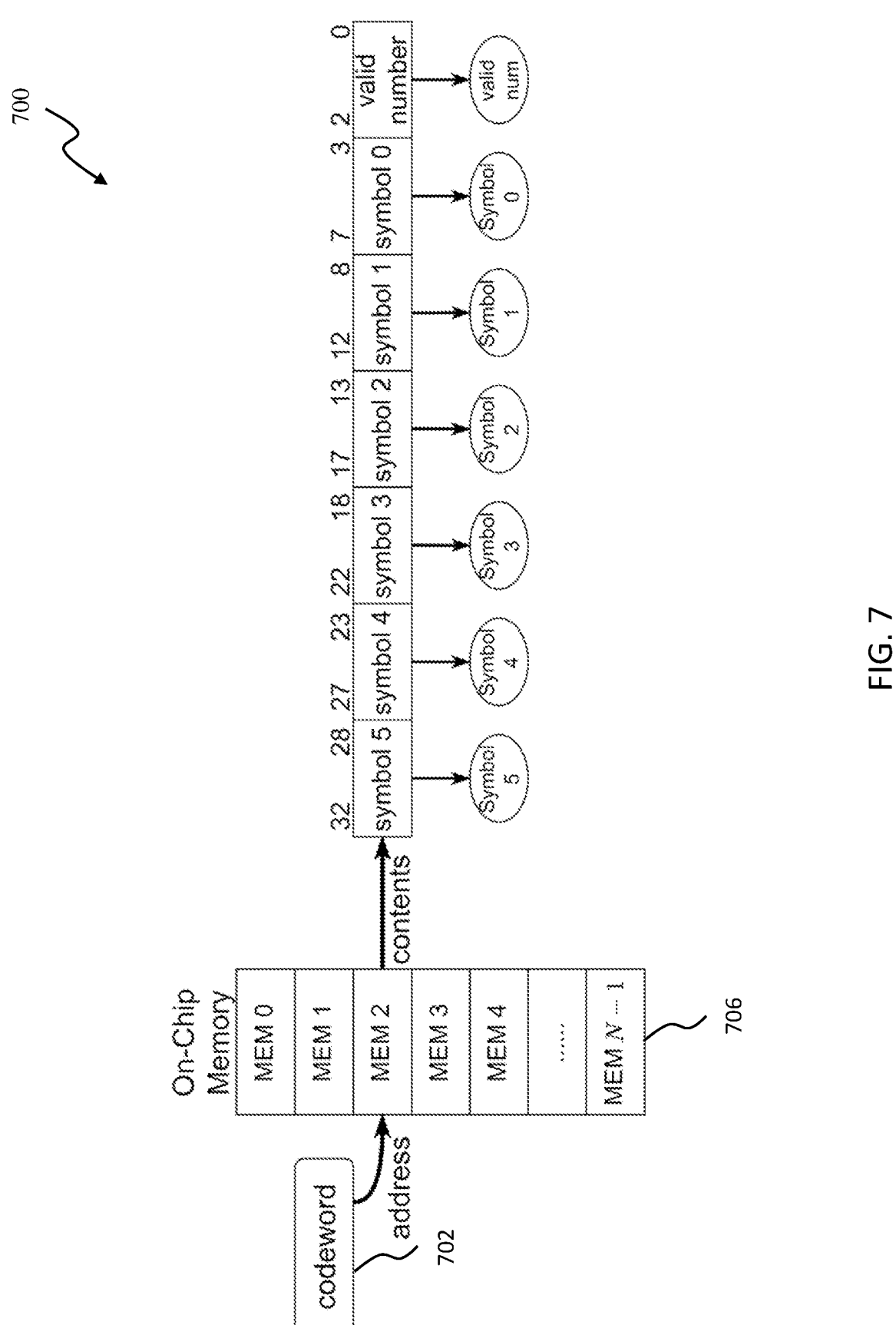
FIG. 7 depicts a schematic drawing showing a first (or memory-oriented (MO)) decoding method according to various first example embodiments of the present invention.

FIG. 7 depicts a schematic drawing showing the first or MO decoding method 700 according to various first example embodiments of the present invention. The MO decoding method 700 comprises: receiving, by a controller, an input codeword 702 of a Tunstall code; and controlling, by the controller, a symbol memory to output decoded symbol(s) stored in one of a plurality of memory entries 706 corresponding to the input codeword 702. In various first example embodiments, the symbol memory is controlled to output the decoded symbol(s) stored in one of the plurality of memory entries based on the input codeword 702 functioning as an address to the above-mentioned one of the plurality of memory entries. In other words, the input codeword 702 may be used as an index to locate or retrieve the decoded symbol(s) (e.g., uncompressed weights of a neural network) stored in the memory entry corresponding to the input codeword 702. For example, if the input codeword 702 is '010', based on such an input codeword functioning as an address or index, the decoded symbol(s) from the third memory entry ("MEM 2") corresponding to such an address or index may be read out. Accordingly, the MO decoding method 700 utilises the codebook (which may also be referred to as the dictionary) of the Tunstall code. In various example embodiments, a dedicated memory segment 706, located on-chip, may be provided for storing the codebook (or a part thereof) of the Tunstall code. For example, as shown in FIG. 7, a predetermined number (N) of memory entries of the dedicated memory segment 706 may be provided to store corresponding N codebook entries. In this regard, when an input codeword 702 is received, the corresponding memory entry having stored therein corresponding decoded symbol(s) (e.g., uncompressed weights of a neural network) may be read. As an illustrative example, FIG. 8 shows an example algorithm (Algorithm 1) for implementing the MO decoding method 700 according to various first example embodiments of the present invention.

Hardware Implementation

Figures 9, 10:
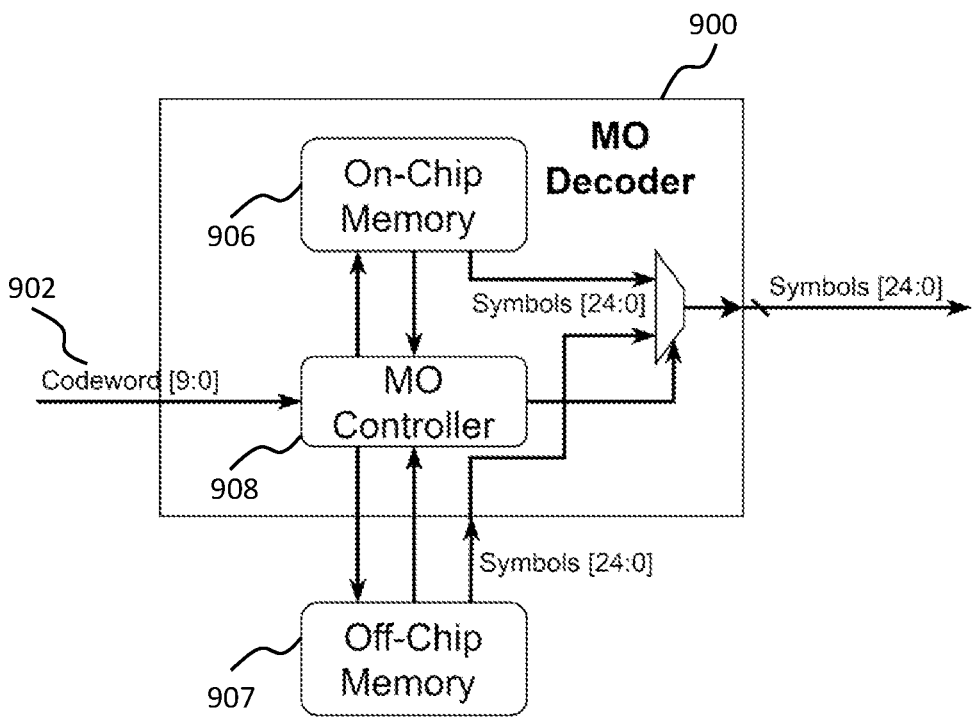
FIG. 9 depicts a schematic drawing of a MO decoder for decoding a codeword of a Tunstall code according to various first example embodiments of the present invention.
FIG. 10 depicts a schematic drawing showing an example data format of decoded symbols stored in the symbol memory for a plurality of codewords, according to various first example embodiments of the present invention.

FIG. 9 depicts a schematic drawing of a MO decoder 900 for decoding a codeword of a Tunstall code according to various first example embodiments of the present invention, corresponding to the MO decoding method 700 as described with reference to FIG. 7 according to various first example embodiments of the present invention. As shown, the MO decoder 900 (which may also be referred to as a tightly-coupled memory based decoder) comprises: a symbol memory 906 comprising a plurality of memory entries (e.g., corresponding to the dedicated memory segment 706 shown in FIG. 7), each memory entry having stored therein decoded symbol(s) of a codeword of the Tunstall code corresponding to the memory entry; and a controller 908 configured to receive an input codeword 902 of the Tunstall code to the decoder 900 and control the symbol memory 906 to output the decoded symbol(s) stored in one of the plurality of memory entries corresponding to the input codeword 902.

In various first example embodiments, the symbol memory 906 is an on-chip memory. In this regard, the controller 908 is communicatively coupled to the symbol memory 906 and an off-chip memory 907. The plurality of memory entries of the symbol memory 906 have stored therein the decoded symbol(s) of a first plurality of codewords of the Tunstall code, respectively. The off-chip memory 907 has stored therein, for each of a second plurality of codewords of the Tunstall code, decoded symbol(s) of the codeword. In this regard, the controller 908 is configured to determine whether the decoded symbol(s) of the input codeword 902 is located in the symbol memory 906 or the off-chip memory 907, and control the determined one of the symbol memory 906 and the off-chip memory 907 to output the decoded symbol(s) of the input codeword 902. In this regard, various first example embodiments note that the whole dictionary (or codebook) of a Tunstall code may be too large (decoded symbols of all codewords of the codebook) to be stored entirely on-chip, and on the other hand, the latency may be too large to read decoded symbols for all codewords off-chip. To address this problem, various example first embodiments advantageously provide the above-mentioned on-chip memory 906 and off-chip memory 907 configuration or architecture.

Accordingly, as shown in FIG. 9 according to various first example embodiments, the MO decoder 900 may comprise two main components, namely, an on-chip memory 906 with a predetermined number (M) of memory entries which stores parts of (or whole of) the dictionary of the Tunstall code, and a MO controller 908. Accordingly, decoded symbol(s) (or uncompressed data) corresponding to the input codeword 902 may then be read directly with only small power consumption if the decoded symbol(s) corresponding to the input codeword 902 is stored in one of the plurality of memory entries of the on-chip memory 906. For example, in this manner, codewords can be decoded every cycle or every two cycles on-chip depending on the type of the on-chip memory 906.

FIG. 10 depicts a schematic drawing showing an example data format of decoded symbols stored in the symbol memory 906 for a plurality of codewords, according to various first example embodiments of the present invention. In FIG. 10, each row shows the decoded symbol(s) stored for a corresponding codeword, and may correspond to a memory word. In the example data format, the width of each decoded symbol (or uncompressed symbol or data) stored in the symbol memory 906 is 5 bits, the number of decoded symbol(s) for one codeword ranges from 1 to 6, and the width of the corresponding codeword is 10 bits.

For example, FIG. 10 shows one decoded symbol stored in a corresponding memory entry for a corresponding first example codeword; two decoded symbols stored in a corresponding memory entry for a corresponding second example codeword; three decoded symbols stored in a corresponding memory entry for a corresponding third example codeword; four decoded symbols stored in a corresponding memory entry for a corresponding fourth example codeword; and six decoded symbols stored in a corresponding memory entry for a corresponding fifth example codeword. In various first example embodiments, each of the plurality of memory entries of the symbol memory 906 has further stored therein a symbol number parameter (which may also be referred to herein as a valid number parameter) indicating the number of decoded symbol(s) of a corresponding codeword stored in the memory entry. Accordingly, the valid number parameter under the valid number field is used to indicate the number of valid decoded symbol(s) in the memory entry (or memory word) of the corresponding codeword. For example, in the example shown in FIG. 10, for the corresponding first example codeword, the valid number parameter "3'b001" indicates that there is one valid decoded symbol stored in the corresponding memory entry for the corresponding first example codeword (e.g., based on such a valid number parameter, the other five symbols in current data read out from the memory entry will be ignored by the receiver). As another example, for the corresponding third example codeword, the valid number parameter "3'b011" indicates that there are three valid decoded symbol stored in the corresponding memory entry for the corresponding third example codeword (e.g., based on such a valid number parameter, the other three symbols in current data read out from the memory entry will be ignored by the receiver). As another example, for the corresponding fifth example codeword, the valid number parameter "3'b101" indicates that there are six valid decoded symbol stored in the corresponding memory entry for the corresponding fifth example codeword.

Accordingly, in the example data format shown in FIG. 10, empty slots indicate that any values or data in current data read out from those empty slots should be ignored by the receiver. For example, in the example data format shown in FIG. 10, the width of each memory word for a corresponding codeword may be 33 bits, whereby every 5 bits between 3rd to 33th bits represent one decoded symbol (or uncompressed symbol) of the corresponding codeword. It will be understood by a person skilled in the present invention is not limited to the example sizes of the example data format shown in FIG. 10, such as the number of symbols and the data width, and that data format of various sizes may be adopted as desired or as appropriate such as based on the size of the codebook.

In various first example embodiments, as described above, the controller 908 may be configured to decide whether to read on-chip or off-chip for the decoded symbols corresponding to the input codeword 902. For example, the controller 908 may be configured in this manner in the case of the number of entries in a codebook exceeds (e.g., far exceeds) the available memory entries in the on-chip memory 906. For example, if the decoded symbol(s) of the input codeword 902 are stored in the on-chip memory 906, the controller 908 may enable the on-chip memory 906, that is, control the on-chip memory 906 to output the decoded symbol(s) corresponding to the input codeword 902. Otherwise, the controller 908 may disable the on-chip memory 906 for the input codeword 902 and request the decoded symbol(s) from the off-chip memory 907 and wait for a response therefrom.

In various first example embodiments, the plurality of memory entries of the symbol memory (i.e., the on-chip memory) 906 may be updated with decoded symbol(s) of a plurality of remapped codewords, respectively. In this regard, the plurality of remapped codewords are at a plurality of codebook entries of an updated codebook replacing a plurality of codewords previously thereat having highest frequency counts. In this regard, for example as explained above, the whole dictionary (or codebook) of a Tunstall code may be too large to be stored (decoded symbols of all codewords) entirely on-chip, and on the other hand, the latency may be too large to read decoded symbols for all codewords off-chip. In this regard, according to various first example embodiments, based on a tradeoff between the size of the on-chip memory 906 and the reading latency, the on-chip memory 906 may be configured to store a predetermined number (M) of top frequent codewords, such as to improve the hit ratio of the decoded symbol(s) of corresponding codewords stored in the on-chip memory 906. Accordingly, the above-mentioned first plurality of codewords correspond to the above-mentioned plurality of remapped codewords (which are now considered the top frequent codewords after being remapped).

Figure 11B:
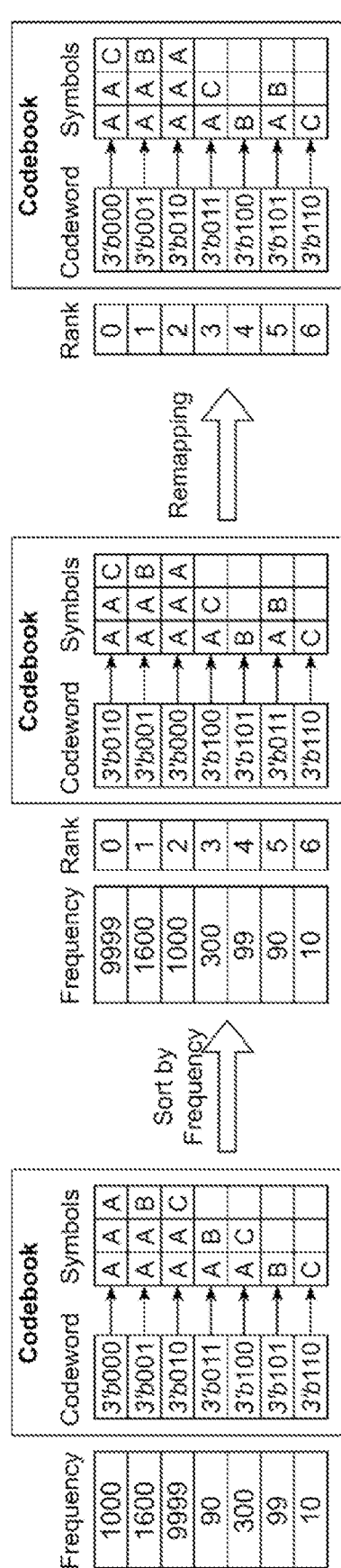
FIG. 11B depicts a schematic flow diagram illustrating the example method for updating an example codebook according to various first example embodiments of the present invention.

As an illustrative example, FIG. 11A depicts an example method or algorithm (Algorithm 2) for updating an example codebook of a Tunstall code (which may also be referred to as a dictionary) according to various first example embodiments of the present invention. For example, this update process may be performed in an offline manner as part of data preparation for optimizing the generation of the Tunstall tree and the codebook. In Algorithm 2, keys(D) denotes the set of codewords of the codebook and values(D) denotes the frequency counts of the codewords. As an illustrative example, FIG. 11B depicts a schematic flow diagram illustrating the example method for updating an example codebook according to various first example embodiments of the present invention, including sorting and remapping the codebook of the Tunstall code. For example, firstly, the frequency of the codewords of an original or initial codebook with respect to a compressed dataset may be counted (as illustrated by the left codebook in FIG. 11B) and the codewords of the codebook (together with their corresponding decoded/uncompressed symbols) may then be sorted based on the frequency counts of the codewords (e.g., from highest to lowest frequency counts) (e.g., as illustrated by the middle codebook in FIG. 11B). Then, all codewords of the sorted codebook are remapped according to their rank (or order) in the sorted codebook, while maintaining the positions of the decoded/uncompressed symbols, to form the updated codebook (e.g., as illustrated by the right codebook in FIG. 11B). For example, in the original or initial codebook, the codeword '010' has a highest frequency count of 9999. In the sorted codebook, this codeword '010', together with its corresponding decoded/uncompressed symbols, is sorted based on its highest frequency count to be at the first entry of the codebook. All codewords of the sorted codebook are then remapped according to their rank (or order), while maintaining the positions of the decoded/uncompressed symbols, to form the updated codebook as illustrated by the right codebook in FIG. 11C. For example, this resulting in the codeword '010' moving to the third entry of the codebook (since the codeword '010' has the third highest rank) and the codeword '000' moving to the first entry of the codebook (since the codeword '000' has the highest rank). Therefore, as illustrated, for example, the codeword '010' previously at the first entry of the codebook due to its highest frequency count has been replaced by the codeword '000' (remapped codeword) at the first entry of the codebook. Furthermore, as can be seen at the right codebook of FIG. 11B, the decoded/uncompressed symbols of the remapped codeword '000' are now remapped to 'AAC' (i.e., the decoded/uncompressed symbols of the previous codeword '010' thereat). Accordingly, a predetermined number of top frequent codewords (i.e., top remapped codewords which are now considered the top frequent codewords after being remapped) of the updated codebook (e.g., the right codebook in FIG. 11B) may be assigned to the plurality of memory entries of the on-chip memory 906, respectively, along with corresponding decoded symbol(s) transferred thereto.

In various first example embodiments, the number of decoded symbols of a corresponding codeword may range from 2 to N, whereby N corresponds to the degree of the Tunstall tree (e.g., N=3 in the example Tunstall tree shown in FIGS. 5A to 5C).

In various first example embodiments, if one decoded symbol (or uncompressed symbols) per cycle is desired or required, the MO decoder 900 may further comprise a multi-write ports FIFO (first in first out) configured to convert parallel decoded symbols to sequential decoded symbols.

Logic-Oriented (LO) Decoding

Decoding Method or Algorithm

Figure 12:
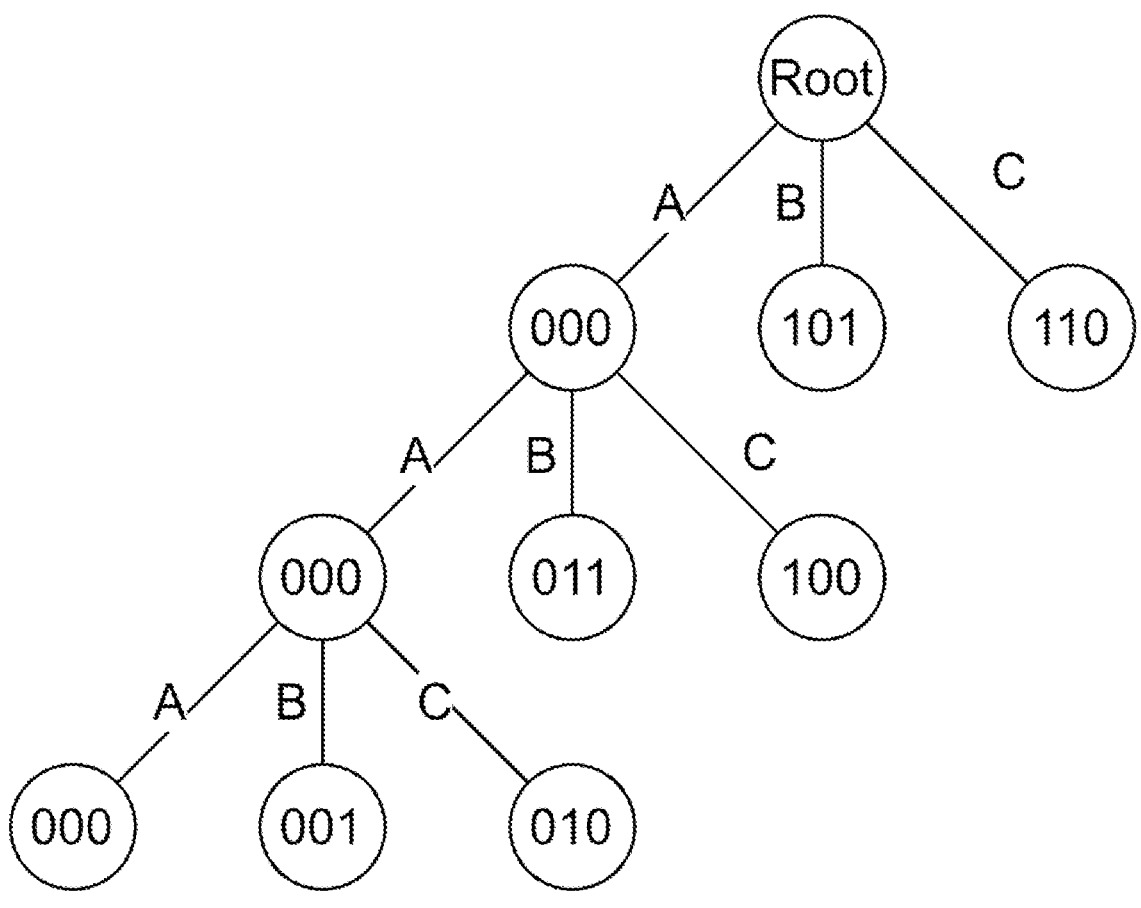
FIG. 12 depicts a schematic drawing of an example Tunstall tree illustrating a second (or logic-oriented (LO)) decoding method according to various second example embodiments of the present invention.

FIG. 12 depicts a schematic drawing of an example Tunstall tree illustrating the second or LO decoding method according to various second example embodiments of the present invention. As illustrated in FIG. 12, the LO decoding method may be based on a reversal of the encoding process illustrated in FIGS. 5A to 5C. As shown in FIG. 12, the Tunstall tree has a plurality of levels and comprises, for each of the plurality of levels, a plurality of nodes corresponding to the level of the Tunstall tree. Furthermore, as shown, the plurality of nodes corresponding to the level of the Tunstall tree have assigned thereto a plurality of codewords of the Tunstall code, respectively. For example, for the example Tunstall tree shown in FIG. 12, there is a root node and a plurality of levels (e.g., levels 1 to 3 in the example) after or under the root node, and a plurality of nodes corresponding to each respective level. Furthermore, as shown in FIG. 12, a decoded symbol (or uncompressed symbol) associated with a node may be represented by an edge or branch (upstream edge or branch) of the node. In this regard, the plurality of decoded symbols associated with the plurality of nodes at a level of the Tunstall tree may be indexed accordingly, such as according to the order of the decoded symbols at the level (e.g., 'A' indexed by '0', 'B' indexed by '1' and 'C' indexed by '2').

As an illustrative example, the decoding of an input codeword '001' according to the LO decoding method according to various second example embodiments will now be described with reference to the example Tunstall tree shown in FIG. 12. First, the input codeword is compared with the three children nodes (codewords '000', '101' and '110') of the root node. In this regard, because the input codeword is between codewords '000' and '101', the node with assigned codeword '000' (which may be simply referred to as node '000') is selected (or determined, e.g., as the determined node for that level (level 1) of the Tunstall tree). As the rank (or order) of the codeword assigned to selected node '000' at level 1 is '0', the decoded symbol of the input codeword with respect to level 1 is 'A' (e.g., since the index of the decoded symbol 'A' at level 1 is '0') (which is the first decoded symbol of the codeword). For example, at level 1, the rank (or order) of codeword '000' is '0', the rank of codeword '101' is '1' and the rank of codeword '110' is '2'. Repeating this process, node '000' at level 2 is selected (or determined) and the second decoded symbol is 'A' (which is the second decoded symbol of the codeword). Finally, as will be explained later below, the decoded symbol of the input codeword with respect to level 3 is 'B' (which is the third and final decoded symbol of the codeword). Accordingly, the input codeword '001' is decoded as a symbol sequence 'AAB'. Accordingly, in various second example embodiments, as can be seen from the example Tunstall tree in FIG. 12, the decoded symbol (uncompressed symbol) at a level of the Tunstall tree may be derived based on the rank of the selected node for that level.

In various second example embodiments, the number of decoded symbols of a corresponding codeword may range from 2 to N, whereby N corresponds to the degree of the Tunstall tree.

FIG. 13 depicts an example method or algorithm (Algorithm 3) for determining the rank (or order) of a codeword associated with a selected node (or determined node) for a level of a Tunstall tree according to various second example embodiments of the present invention, where c denotes an input codeword being decoded and nc denotes the codewords assigned to the plurality of nodes at the level. First, the input codeword (c) is compared with a plurality of codewords (nc) assigned to a plurality of nodes corresponding to the level of the Tunstall tree. For example, for each of the plurality of codewords assigned to the plurality of nodes, the input codeword is compared with the codeword assigned to the node on whether the input codeword is greater than or equal to the codeword assigned to the node (e.g., if so, '1' is assigned, otherwise, '0' is assigned). For example, the result of this comparison is denoted by "compResult" in Algorithm 3. One of the plurality of nodes may then be determined as the determined node for the level of the Tunstall tree based on the comparison. For example, this may be performed based on the "onehot" function shown in Algorithm 3, where the compResult is XOR (exclusive or) with an array of made of up '0' and the most significant bit (msb) to the second least significant bit (lsb) of the compResult. This function is configured to find the first '1' in the compResult (e.g., onehot of '001' is '001', onehot of '011' is '010' and onehot of '111' is '100'). The onehot result may then be converted to an integer (r), such as using a lookup table in the circuit (e.g., '001' converted into '0', '010' converted into '1' and '100' converted into '2'), and such an integer represents the rank (or order) of the codeword associated with the selected node (or determined node) for the level of the Tunstall tree. In this regard, the decoded symbol with respect to the level of the Tunstall tree may thus be obtained (or retrieved) based on its index corresponding to (or equal to) the rank of the codeword associated with the selected node.

Figure 14:
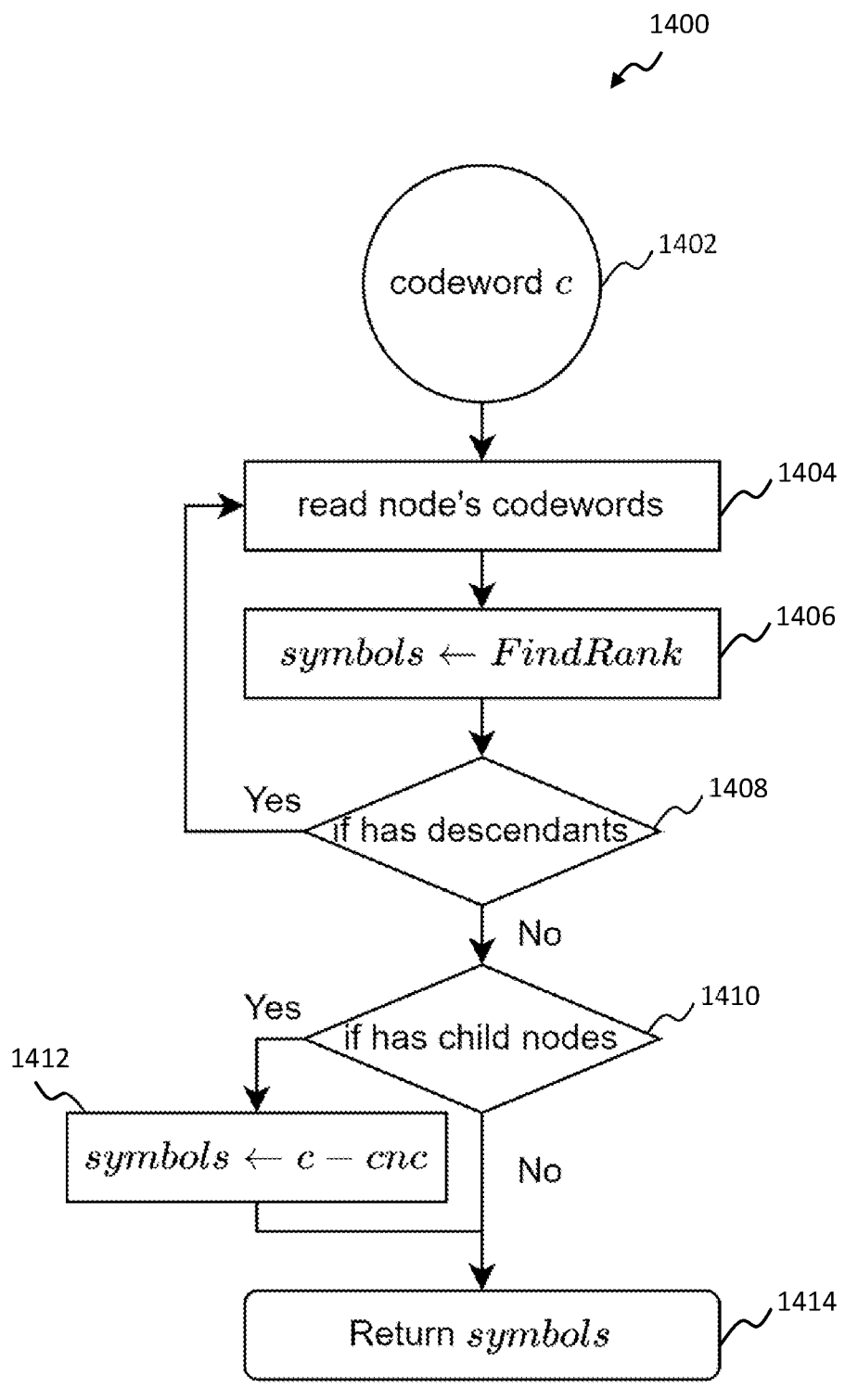
FIG. 14 depicts a schematic flow diagram of the LO decoding method according to various second example embodiments of the present invention.

FIG. 14 depicts a schematic flow diagram of the LO decoding method 1400 according to various second example embodiments of the present invention. The LO decoding method 1400 comprises: receiving (at 1402) an input codeword for decoding; reading (at 1404) the codewords assigned to the plurality of nodes at a first level of the Tunstall tree; producing (at 1406) a decoded symbol with respect to the first level of the Tunstall tree, which includes determining the rank (or order) of the codeword associated with the selected node for the first level of the Tunstall tree; and determining (at 1408) whether the selected node for the first level of the Tunstall tree has associated therewith a descendant node (i.e., a node two levels down from the selected node according to the Tunstall tree). As shown in FIG. 14, the method 1400 performs an iterative loop including steps 1404, 1406 and 1408 for each level of the Tunstall tree having a selected node determined to have associated therewith a descendent node, with each iteration starting at the next level of the Tunstall tree with respect to the current level of the Tunstall tree. For example, the method 1400 loops back to read (at 1404) the codewords assigned to the plurality of nodes at the next level (which now becomes the current level) of the Tunstall tree and produce (at 1406) a decoded symbol with respect to the current level of the Tunstall tree, which includes determining the rank of the codeword associated with the selected node for the current level of the Tunstall tree. If at 1408, the selected node for the current level of the Tunstall tree does not have associated therewith a descendant node, the method 1400 comprises determining (at 1410) whether the selected node for the current level of the Tunstall tree has associated therewith a child node (i.e., a node one level down from the selected node according to the Tunstall tree). If so, the method 1400 comprises determining a decoded symbol with respect to a next level of the Tunstall tree (with respect to the current level) by subtracting the input codeword with the codeword assigned to the selected node. For example, if the input codeword is '010' and the codeword assigned to the selected node is '000', subtracting '010' with '000' is '010' in binary or '2' in octal. In this regard, referring to the example shown in FIG. 12, the decoded symbol at level 3 having an index of '2' is 'C', and thus, 'C' is the decoded symbol of the input codeword with respect to level 3. If not, the method 1400 returns (at 1414) the decoded symbol(s) of the input codeword and ends. That is, the decoding of the input codeword has been completed.

Figure 16:
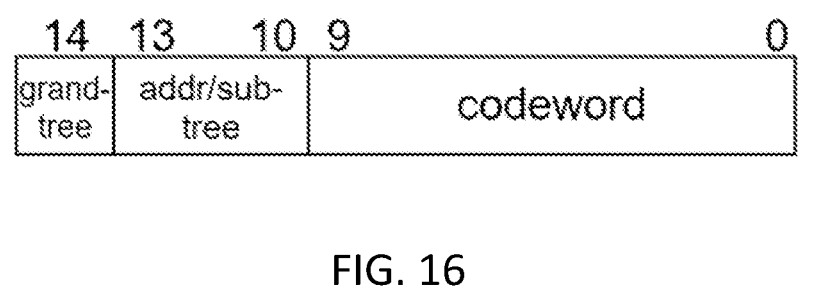

As an illustrative example, FIG. 15 shows an example algorithm (Algorithm 4) for implementing the MO decoding method 700 according to various second example embodiments of the present invention, where c denotes an input codeword being decoded, ne denotes an array of codewords assigned to a plurality of nodes at a level of the Tunstall tree; ns denotes an array of Boolean values indicating whether each of a plurality of nodes at a level of the Tunstall tree has a child; na denotes an array of node addresses at a level of the Tunstall tree; and ng denotes an array of Boolean values indicating whether each of a plurality of nodes at a level of the Tunstall tree has a descendant. In various second example embodiments, each node (n) has associated therewith information including the assigned codeword (in nc), whether the node has a child (in ns) and whether the node has a descendant (in na). As an illustrative example, FIG. 16 depicts an example data format for such information associated with a node (n).

Hardware Implementation

According to various second example embodiments, there is provided a LO decoder for decoding a codeword of a Tunstall code, comprising one or more sub-decoders, a symbol memory and a controller.

As a first example configuration or architecture, the LO decoder may be configured to have N pipeline stages. In this regard, the first N-1 pipeline stages may each include a sub-decoder and the last pipeline stage may include a subtractor. Each sub-decoder may be configured to decode a corresponding level of the Tunstall tree to produce the corresponding decoded symbol with respect to the corresponding level of the Tunstall tree. For example, in the case of the Tunstall tree depth being larger than the number of sub-decoders in the LO decoder, the last sub-decoder in the N-1 pipeline stages may iteratively decode multiple levels of the Tunstall tree to produce the corresponding decoded symbol with respect to each of the multiple levels of the Tunstall tree. As an example, assuming that the Tunstall tree has 8 levels and the LO decoder has a pipeline of five sub-decoders, the last sub-decoder in the pipeline may thus be configured to iteratively decode 3 levels of the Tunstall tree (i.e., levels 5 to 7) if needed, with the subtractor decoding the last level if needed.

As a second example configuration or architecture, the LO decoder may be configured to have only one sub-decoder instead of multiple sub-decoders in the above-mentioned first example. In this regard, the sub-decoder may be configured to iteratively decode multiple levels of the Tunstall tree to produce the corresponding decoded symbol with respect each of the multiple levels of the Tunstall tree. In this regard, a state machine may be provided for controlling the sub-decoder to iteratively decode each of the multiple levels of the Tunstall tree. Similar to the first example, the LO decoder may also comprise a subtractor.

Figure 17:
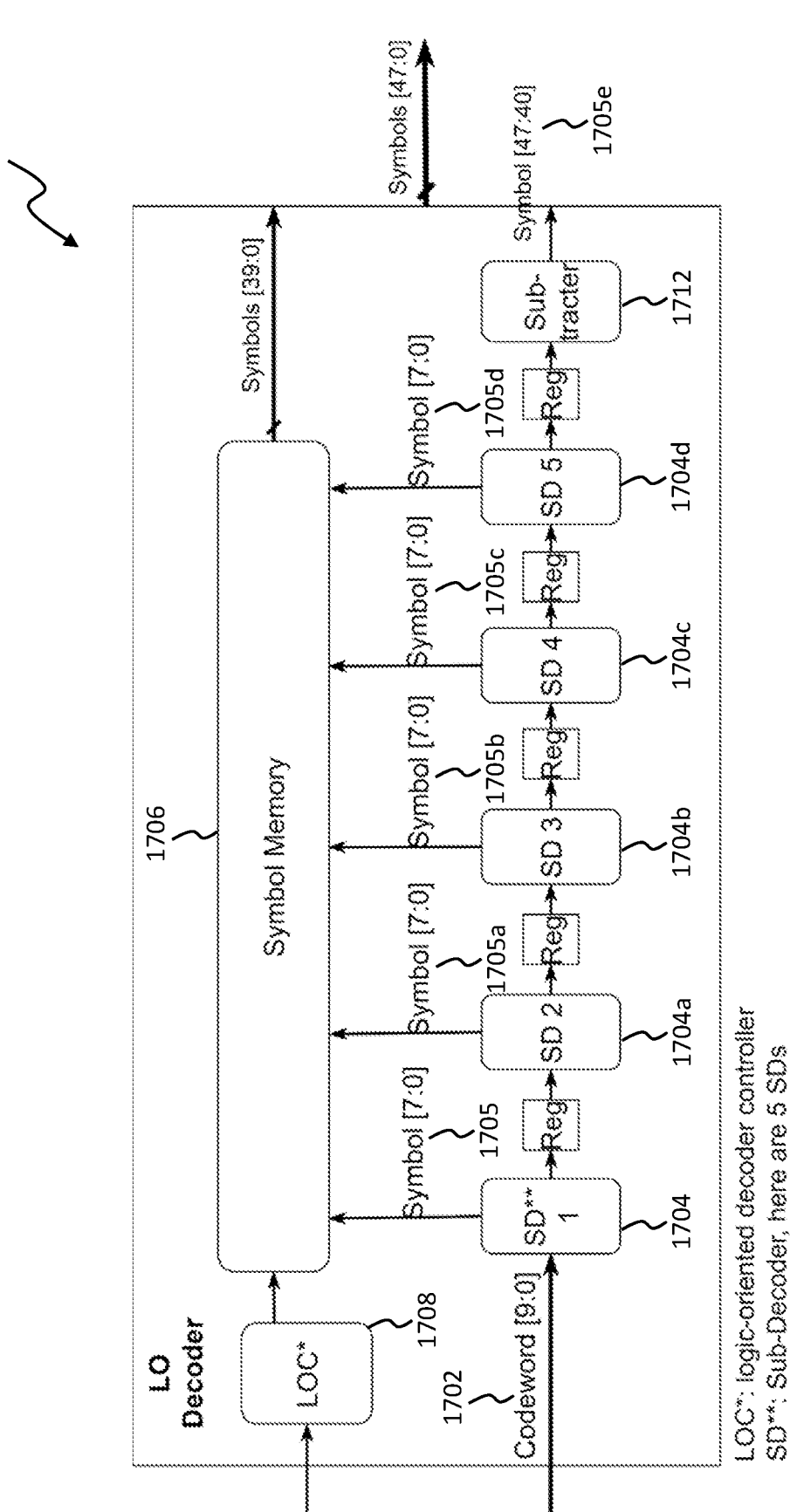
FIG. 17 depicts a schematic drawing showing an example LO decoder, having a first example configuration or architecture, according to various second example embodiments of the present invention.

FIG. 17 depicts a schematic drawing showing an example LO decoder 1700 having the above-mentioned first example configuration or architecture according to various second example embodiments of the present invention. The LO decoder 1700 comprises a sub-decoder 1704 configured to receive an input codeword 1702 of the Tunstall code to the LO decoder 1700 and output a decoded symbol 1705 of the input codeword 1702; a symbol memory 1706 configured to receive and store the decoded symbol 1705 of the input codeword 1702 from the sub-decoder 1704; and a controller 1708 configured to control the symbol memory 1706 to output one or more decoded symbols stored in the symbol memory 1706.

Figure 18:
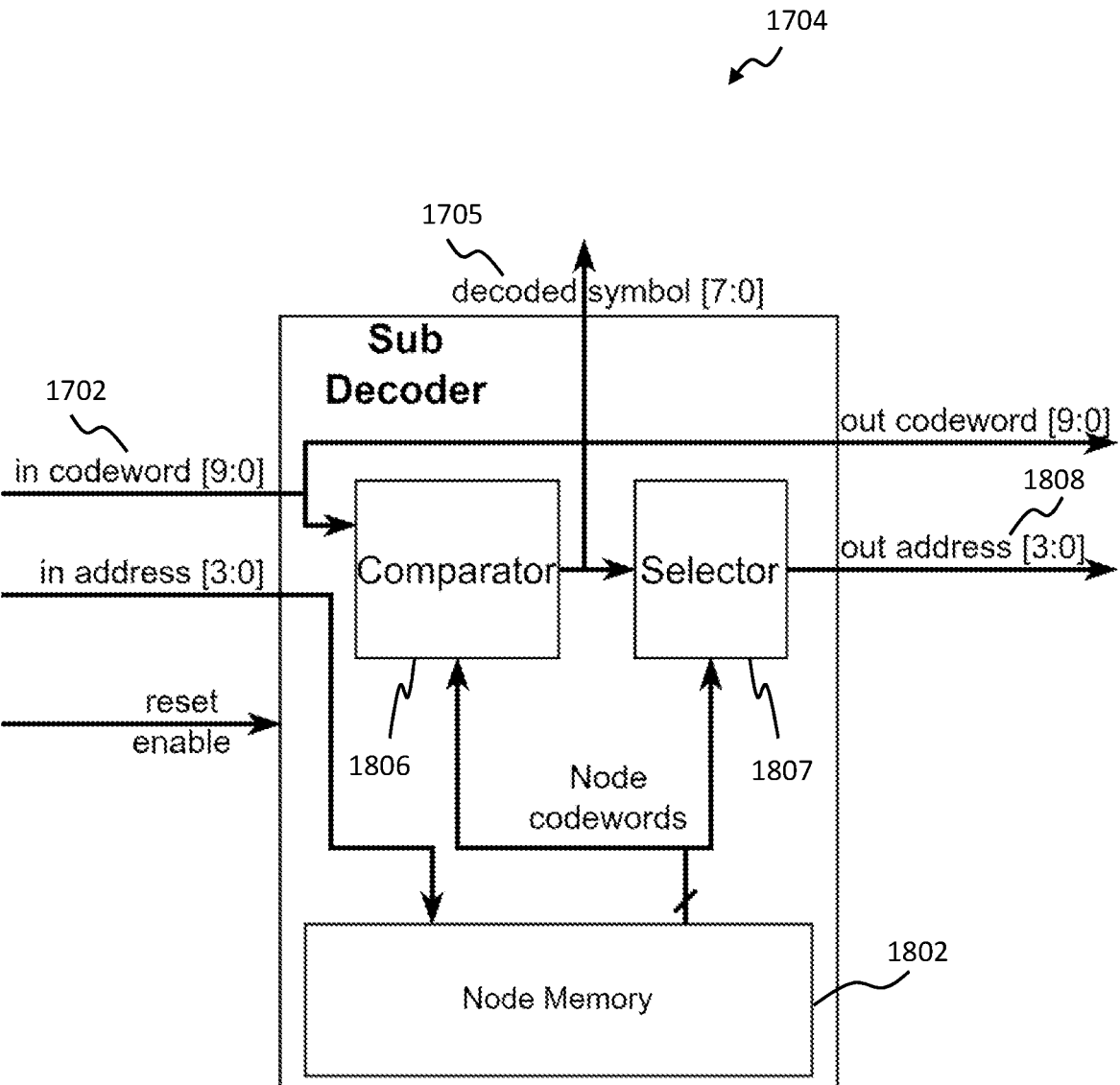
FIG. 18 depicts a schematic drawing shown an example architecture of a sub-decoder of an LO decoder according to various second example embodiments of the present invention.

FIG. 18 depicts a schematic drawing shown an example architecture of the sub-decoder 1704 according to various second example embodiments of the present invention. The sub-decoder 1704 comprises: a node memory 1802 configured to store, for a plurality of nodes of the Tunstall tree of the Tunstall code corresponding to a first level of the Tunstall tree, a plurality of codewords of the Tunstall code assigned to the plurality of nodes, respectively; and a comparator 1806 configured to compare the input codeword 1702 with the plurality of codewords assigned to the plurality of nodes corresponding to the first level of the Tunstall tree received from the node memory 1802 and produce the decoded symbol 1705 of the input codeword 1702 with respect to the first level of the Tunstall tree based on the comparison.

In various second example embodiments, the above-mentioned produce the decoded symbol 1705 of the input codeword 1702 with respect to the first level of the Tunstall tree comprises: determining one of the plurality of nodes corresponding to the first level of the Tunstall tree as a determined node for the first level of the Tunstall tree based on the comparison; and producing the decoded symbol 1705 of the input codeword 1702 with respect to the first level of the Tunstall tree based on the determined node.

In various second example embodiments, the sub-decoder 1704 is further configured to: determine whether the determined node for the first level of the Tunstall tree has associated therewith a descendant node, the descendant node being two levels down from the determined node according to the Tunstall tree; and obtain an address 1808 (e.g., start address) of a plurality of nodes of the Tunstall tree corresponding to a next level of the Tunstall tree with respect to the first level of the Tunstall tree based on determining that (i.e., if it is determined that) the determined node for the first level of the Tunstall tree has associated therewith the descendent node. For example, as shown in FIG. 16, the example data format for node information associated with a node comprises a start address of child node(s) of the node (i.e., bits [10:13] of the example data format). In this regard, the above-mentioned address 1808 of the plurality of nodes corresponding to the next level of the Tunstall tree is the start address of the child node(s) of the determined node and can thus be obtained from the node memory 1802.

In various second example embodiments, according to the first example configuration or architecture, the sub-decoder 1704 further comprises a selector 1807 communicatively coupled to the comparator 1806 and the node memory 1802 and configured to perform the above-mentioned determine whether the determined node for the first level of the Tunstall tree has associated therewith the descendant node and the above-mentioned obtain the address of the plurality of nodes of the Tunstall tree corresponding to the next level of the Tunstall tree. For example, the selector 1807 may receive the decoded symbol 1705 from the comparator 1806 and the node information associated with the plurality of nodes corresponding to the first level of the Tunstall tree from the node memory 1802 (based on the input address to the sub-decoder 1704). For example, the selector 1807 may comprise a multiplexer configured to receive the decoded symbol 1705 as an input select signal for selecting the node information associated with the determined node (amongst the plurality of nodes) for the first level of the Tunstall tree. In this regard, as will be described later below with reference to FIG. 16, for example, the most significant bit of the node information indicates whether the node has a descendant (e.g., '1' indicates yes or true while '0' indicates no or false). If the node has a descendant, then bits [10:13] of the node information represent the start address of child node(s) in the node memory 1802, which thus can be obtained and output by the selector 1807 if it is determined that the determined node for the first level of the Tunstall tree has a descendent.

In various second example embodiments, according to the first example configuration or architecture, the LO decoder 1700 may further comprise one or more additional sub-decoders (e.g., four additional sub-decoders 1704*a*, 1704*b*, 1704*c*, 1704*d* in the example shown in FIG. 17). In this regard, the sub-decoder 1704 is a first sub-decoder and is associated with the first level of the Tunstall tree, and the one or more additional sub-decoders 1704*a*, 1704*b*, 1704*c*, 1704*d* are associated with one or more additional levels of the Tunstall tree, respectively. In the same or similar manner as the sub-decoder 1704, each of the one or more additional sub-decoders 1704*a*, 1704*b*, 1704*c*, 1704*d* may be configured to receive the input codeword 1702 and output a decoded symbol 1710 of the input codeword 1702 with respect to the level of the Tunstall tree associated with the additional sub-decoders (e.g., the additional sub-decoders 1704*a*, 1704*b*, 1704*c*, 1704*d* in the example shown in FIG. 17 are configured to output decoded symbols 1705*a*, 1705*b*, 1705*c*, 1705*d*, respectively). In the same or similar manner as the sub-decoder 1704 as described with reference to FIG. 18, each additional sub-decoder may also comprise: a node memory configured to store, for a plurality of nodes of the Tunstall tree of the Tunstall code corresponding to the level of the Tunstall tree associated with the additional sub-decoder, a plurality of codewords of the Tunstall code assigned to the plurality of nodes, respectively; and a comparator configured to compare the input codeword with the plurality of codewords assigned to the plurality of nodes corresponding to the level of the Tunstall tree associated with the additional sub-decoder received from the node memory and produce a decoded symbol of the input codeword with respect to the level of the Tunstall tree associated with the additional sub-decoder based on the comparison. That is, each additional sub-decoder may be configured in the same or similar manner as the sub-decoder 1704 as described with reference to FIG. 18 according to various second example embodiments.

Accordingly, in the same or similar manner as the sub-decoder 1704, the above-mentioned produce the decoded symbol of the input codeword 1702 with respect to the level of the Tunstall tree associated with the additional sub-decoder may comprise: determining one of the plurality of nodes corresponding to the level of the Tunstall tree as a determined node for the level of the Tunstall tree based on the comparison; and producing the decoded symbol of the input codeword 1702 with respect to the level of the Tunstall tree associated with the additional sub-decoder based on the determined node.

In various second example embodiments, according to the first example configuration or architecture, the first sub-decoder 1704 is configured to, based on determining that (i.e., if it is determined that) the determined node for the first level of the Tunstall tree associated with the first sub-decoder 1704 has associated therewith the descendent node, output the address 1808 of the plurality of nodes corresponding to the next level of the Tunstall tree with respect to the first level of the Tunstall tree to an additional sub-decoder 1704*a* of the one or more additional sub-decoders 1704*a*, 1704*b*, 1704*c*, 1704*d* associated with the next level of the Tunstall tree for the comparator of the additional sub-decoder 1704*a* to compare the input codeword 1702 with the plurality of codewords assigned to the plurality of nodes corresponding to the next level of the Tunstall tree received from the node memory of the additional sub-decoder 1704*a* based on the address 1808 of the plurality of nodes received and produce the decoded symbol 1705*a* of the input codeword 1702 with respect to the next level of the Tunstall tree associated with the additional sub-decoder 1704*a* based on the comparison. In this regard, the additional sub-decoder 1704*a* is further configured to output the decoded symbol 1705*a* of the input codeword 1702 with respect to the next level of the Tunstall tree associated with the additional sub-decoder 1704*a* to the symbol memory 1706.

In various second example embodiments, according to the first example configuration or architecture, in the same or similar manner as the sub-decoder 1704, each additional sub-decoder of the one or more additional sub-decoders 1704*a*, 1704*b*, 1704*c*, 1704*d* is configured to, based on determining that (i.e., if it is determined that) the determined node for the level of the Tunstall tree associated with the additional sub-decoder has associated therewith the descendent node, output an address of the plurality of nodes corresponding to a next level of the Tunstall tree with respect to the level of the Tunstall tree to another additional sub-decoder associated with its next level of the Tunstall tree (e.g., additional sub-decoder 1704*a* may output the address corresponding to the next level to additional sub-decoder 1704*b*, and additional sub-decoder 1704*b* may output the address corresponding to its next level to additional sub-decoder 1704*c* and so on) for the comparator of said another additional sub-decoder to compare the input codeword 1702 with the plurality of codewords assigned to the plurality of nodes corresponding to the next level of the Tunstall tree received from the node memory of said another additional sub-decoder based on the address of the plurality of nodes received and produce the decoded symbol of the input codeword 1702 with respect to the next level of the Tunstall tree based on the comparison. In this regard, said another additional sub-decoder is also configured to output the decoded symbol of the input codeword 1702 with respect to the next level of the Tunstall tree to the symbol memory 1706. Accordingly, in the same or similar manner as the first sub-decoder 1704, each additional sub-decoder may also further comprise a selector communicatively coupled to the comparator and the node memory of the additional sub-decoder and configured to determine whether the determined node for the level of the Tunstall tree associated with the additional sub-decoder has associated therewith a descendant node and configured to obtain the above-mentioned address of the plurality of nodes corresponding to the next level of the Tunstall tree with respect to the level of the Tunstall tree.

In various second example embodiments, as explained above, in the case of the Tunstall tree depth being larger than the number of sub-decoders in the LO decoder 1700, the last sub-decoder (e.g., additional sub-decoder 1704*d* in the example shown in FIG. 17) in the N–1 pipeline stages may iteratively decode multiple levels of the Tunstall tree to produce the corresponding decoded symbol with respect to each of the multiple levels of the Tunstall tree.

In various second example embodiments, according to the first example configuration or architecture, each sub-decoder of the first sub-decoder 1704 and the one or more additional sub-decoders 1704*a*, 1704*b*, 1704*c*, 1704*d* is configured to, based on determining that the determined node for the level of the Tunstall tree associated with the sub-decoder does not have associated therewith the descendent node, determine (e.g., by the selector of the sub-decoder) whether the determined node for the level of the Tunstall tree associated with the sub-decoder has associated therewith a child node, wherein the child node is one level down from the determined node according to the Tunstall tree. In this regard, the LO decoder 1700 further comprises a subtractor 1712 configured to, based on the sub-decoder determining that the determined node for the level of the Tunstall tree associated with the sub-decoder has associated therewith the child node, produce a decoded symbol 1705*e* of the input codeword 1702 with respect to a next level of the Tunstall tree with respect to the level of the Tunstall tree based on the input codeword 1702 and the codeword assigned to the determined node for the level of the Tunstall tree associated with the sub-decoder.

As described hereinbefore, according to the above-mentioned second example configuration or architecture, the LO decoder may be configured to have only one sub-decoder 1704 instead of multiple sub-decoders (i.e., without additional sub-decoders 1704*a*, 1704*b*, 1704*c*, 1704*d*) shown in FIG. 17. In this regard, the sub-decoder 1704 may be configured to iteratively decode multiple levels of the Tunstall tree to produce the corresponding decoded symbol with respect each of the multiple levels of the Tunstall tree. As an example, assuming that the Tunstall tree has 8 levels, the one sub-decoder 1704 may thus be configured to iteratively decode 7 levels of the Tunstall tree (i.e., levels 1 to 7) if needed, with the subtractor decoding the last level if needed. In this regard, a state machine may be provided (e.g., performed by the controller 1708) for controlling the sub-decoder 1704 to iteratively decode each of the multiple levels of the Tunstall tree.

In various second example embodiments, according to the second example configuration or architecture, the node memory 1802 may be configured to store, for each level of a plurality of levels of the Tunstall tree, including the above-mentioned first level of the Tunstall tree, and for a plurality of nodes of the Tunstall tree corresponding to the level of the Tunstall tree, a plurality of codewords of the Tunstall code assigned to the plurality of nodes corresponding to the level of the Tunstall tree, respectively. In this regard, the comparator 1806 is configured to, based on the sub-decoder 1704 (e.g., by the selector 1807 of the sub-decoder 1704) determining that the determined node for a level of the Tunstall tree has associated therewith the descendent node: compare the input codeword with the plurality of codewords assigned to the plurality of nodes of the Tunstall tree corresponding to a next level of the Tunstall tree with respect to the level of the Tunstall tree received from the node memory 1802 based on an address of the plurality of nodes of the Tunstall tree corresponding to the next level of the Tunstall tree; determine one of the plurality of nodes corresponding to the next level of the Tunstall tree as a determined node for the next level of the Tunstall tree based on the comparison; and produce a decoded symbol of the input codeword with respect to the next level of the Tunstall tree based on the determined node for the next level of the Tunstall tree. In this regard, the sub-decoder 1704 is further configured to output the decoded symbol 1705 of the input codeword 1702 with respect to the next level of the Tunstall tree to the symbol memory 1706.

In various second example embodiments, according to the second example configuration or architecture, the sub-decoder 1704 is further configured to, based on determining that the determined node for a level of the Tunstall tree does not have associated therewith the descendent node, determine (e.g., by the selector 1807 of the sub-decoder 1704) whether the determined node for the level of the Tunstall tree has associated therewith a child node, wherein the child node is one level down from the determined node according to the Tunstall tree. In this regard, the LO decoder further comprises a subtractor 1712 configured to, based on the sub-decoder 1704 determining that the determined node for the level of the Tunstall tree has associated therewith the child node, produce a decoded symbol of the input codeword 1702 with respect to a next level of the Tunstall tree with respect to the level of the Tunstall tree based on the input codeword 1702 and the codeword assigned to the determined node for the level of the Tunstall tree.

Accordingly, in various second example embodiments, each sub-decoder may be configured to decode one symbol per clock cycle. As described hereinbefore, each sub-decoder may comprise a comparator 1806, a selector 1807 and a node memory 1802. As described hereinbefore, the comparator 1806 is configured to compare the input codeword 1702 with the codewords assigned to a plurality of nodes corresponding to a level of the Tunstall tree (i.e., all codewords stored corresponding to the level of the Tunstall tree) and output the decoded symbol with respect to such a level of the Tunstall tree. For example, as described in Algorithm 3 shown in FIG. 13, the comparator 1806 may be configured to generate a '1' or '0' if the stored codeword is smaller or larger than/equal to the input codeword 1702, respectively. The output of all comparisons for the level of the Tunstall tree is then one-hot encoded to generate the corresponding decoded symbol. As described hereinbefore, the selector 1807 may be configured to select the corresponding address for the next stage sub-decoder based on the decoded symbol of the current stage sub-decoder.

As described hereinbefore, the node memory 1802 may store information for a plurality of nodes of the Tunstall tree, including, for each of the plurality of nodes, the assigned codeword to the node, whether the node has a child and whether the node has a descendant. An example data format for such information associated with a node is shown in FIG. 16. The subtracter 1712 may be the last module in the pipeline of the LO decoder and is configured to decode the leaf node if needed, such as by performing the operation of line 12 of Algorithm 4 shown in FIG. 15. In particular, the subtracter 1712 may be configured to subtract the input codeword 1702 with the determined node's codeword and output the last decoded symbol 1705*e* of the input codeword 1702.

The symbol memory 1706 may comprise a plurality of memory banks (or a plurality of sets of register files), each memory bank (or each set of register files) being configured to store decoded symbol(s) (e.g., decoded weights) (e.g., up to N–1 decoded symbols 1705, 1705*a*, 1705*b*, 1705*c*, 1705*d*) of the corresponding codeword from the sub-decoder (s) (e.g., up to N−1 sub-decoders 1704, 1704*a*, 1704*b*, 1704*c*, 1704*d*) during the decoding process. Once the last decoded symbol 1705*e* of the input codeword 1702 is obtained from the subtracter 1712, or the plurality of memory banks are full, the controller 1708 may then control the symbol memory 1706 to output (or read out) the decoded symbol(s) of the input codeword 1702 stored in the corresponding memory bank of the symbol memory 1706. Accordingly, the controller 1708 may be configured to control the symbol memory 1706 to output, for each of the plurality of memory banks, the decoded symbol(s) of the corresponding codeword stored in the memory bank. In this regard, the controller 1708 may be configured to control the writing and reading the plurality of memory banks of the symbol memory 1706. For example, during a cycle, the controller 1708 may enable writing N−1 symbols decoded by the N−1 sub-decoders into the corresponding N−1 memory banks and outputting N−1 decoded symbols of a codeword from another memory bank together with the last decoded symbol of the codeword from the subtracter 1712. If the number of symbols encoded into one codeword is more than the number of sub-decoders in the decoder, the controller 1708 may be configured to gate the clock of sub-decoders off except the last sub-decoder 1705*d* while waiting the last sub-decoder 1705*d* to decode the additional symbols iteratively as described hereinbefore.

In various second example embodiments, the width of the decoded symbol may be 5 bits, the number of decoded symbols of one codeword may range from 2 to 6 and the width of the codeword may be 10 bits. Referring to the example data format of the node information associated with a node as shown in FIG. 16, in various second example embodiments, the example data format for the node information may be 15 bits, where bits [9:0] represent the codeword assigned to the node. The most significant bit indicates whether the node has a descendant (i.e., whether the child node of the node has a child node), for example, '1' indicates yes or true while '0' indicates no or false. If the node has a descendant, then bits [10:13] represent the start address of child node(s) (e.g., start/beginning of all addresses of the child nodes) in the node memory. Otherwise (e.g., if the most significant bit indicates '0'), then bit 10 indicates whether the node has a child node, for example, '1' indicates yes or true while '0' indicates no or false. It will be understood by a person skilled in the present invention is not limited to the example sizes of the example data format shown in FIG. 16, and that data format of various sizes may be adopted as desired or as appropriate such as based on the size of the codebook.

In various second example embodiments, if one decoded symbol (or uncompressed symbols) per cycle is desired or required, the LO decoder may further comprise a multi-write ports FIFO (first in first out) configured to convert parallel decoded symbols to sequential decoded symbols.

In various first example embodiments, for the MO decoder 900, regarding the type of the on-chip memory 906, for example, either SRAM or register banks may be chosen as the on-chip memory. In this regard, SRAM is smaller but slower than register banks. Accordingly, it will be appreciated by a person skilled in the art that the type of the on-chip memory 906 may be selected as desired or as appropriate depending on various factors.

In various first example embodiments, for the MO decoder 900, regarding the number of on-chip memory entries, as can be seen from Algorithm 1 shown in FIG. 8, more memory entries take less decoding cycles as more pairs of the codebook (e.g., decoded symbol(s) and the associated valid number parameter shown in FIG. 10) are stored on-chip and less are read off-chip, which is much slower but consumes more energy. However, when the dictionary is too large to be stored on-chip, or the area is limited, only a predetermined number (M) of top frequent codebook pairs are stored on-chip, where M corresponds to the number of memory entries of the on-chip memory 906. In this regard, as described hereinbefore with reference to FIG. 11B, pairs in the codebook are sorted by the frequency and values are remapped according to the order. As a result, infrequent pairs may be read off-chip. Accordingly, it will be appreciated by a person skilled in the art that the number of on-chip memory entries may be determined as desired or as appropriate depending on various factors.

In various second example embodiments, for the LO decoder, regarding the number of node memory banks in one sub-decoder, as can be seen from Algorithm 3 in FIG. 13, for example, the number of node memory banks in one sub-decoder reflects the maximum value of weights it works well. If the number of node memory banks exceeds the maximum value of weights, the LO decoder takes additional cycles to downwind the range of the symbol and dose decoding. For example, the maximum value of the rank output from Algorithm 3 may equal to the number of node memory banks in one sub-decoder. If the maximum value of the weights is not greater than the number of node memory banks, then the output from Algorithm 3 is the corresponding decoded symbol (e.g., uncompressed weight). Otherwise, for example, the weights are from 0 to 63, while there are only 8 node memory banks. It thus takes $\log(8)(64)=2$ runs to obtain the final results. The range (0, 63) may be divided into 8 sub-ranges (0, 7), (8, 15), . . . (56, 63). For example, in the first run, the result is one of the sub-ranges indexed by the rank (e.g., if the rank=5, the result is (40, 47)). In the second run, the result is one of the values of a sub-range indexed by the rank (e.g., for the sub-range (40, 47), if the rank=5, the result is 45).

In various second example embodiments, for the LO decoder, regarding the number of sub-decoders, for example, each sub-decoder may perform the operations of Algorithm 4 shown in FIG. 15 in parallel. Therefore, the number of sub-decoders limits the maximum number of symbols that can be decoded per cycle. Accordingly, more sub-decoders may be provided to reduce the decoding time, however, this will result in an increase in the hardware resources usage. Accordingly, it will be appreciated by a person skilled in the art that the number of sub-decoders may be determined as desired or as appropriate depending on various factors.

Performance Evaluation

In various example embodiments, the MO and LO decoders are synthesized by Vivado and ran on FPGA.

FIG. 19 depicts a table (Table II) showing the resources usages and the corresponding clock cycles to decode Res-Net-50 and MobileNet-v2 CNNs of MO decoders with different memory entries and memory type. For example, it can be seen that the 64 entries MO decoder reduce 16× memory capacity while taking 2.36× and 2.49× more cycles than the 1024 entries MO decoder to decode ResNet-50 and MobileNet-v2.

FIG. 20 depicts a table (Table III) showing the resources usages and the corresponding cycles to decode ResNet-50 and MobileNet-v2 CNNs of LO decoders with different number of sub-decoders and node memory banks. For example, it can be seen that reducing the number of node memory banks from 27 to 10 decreases around 20% resources usage while increases 3% decoding cycles. Furthermore, around 3× accelerating is gained by adding 7 more sub-decoders.

System-Level Impact on Deep Learning Accelerators

System Diagram

Figure 21:
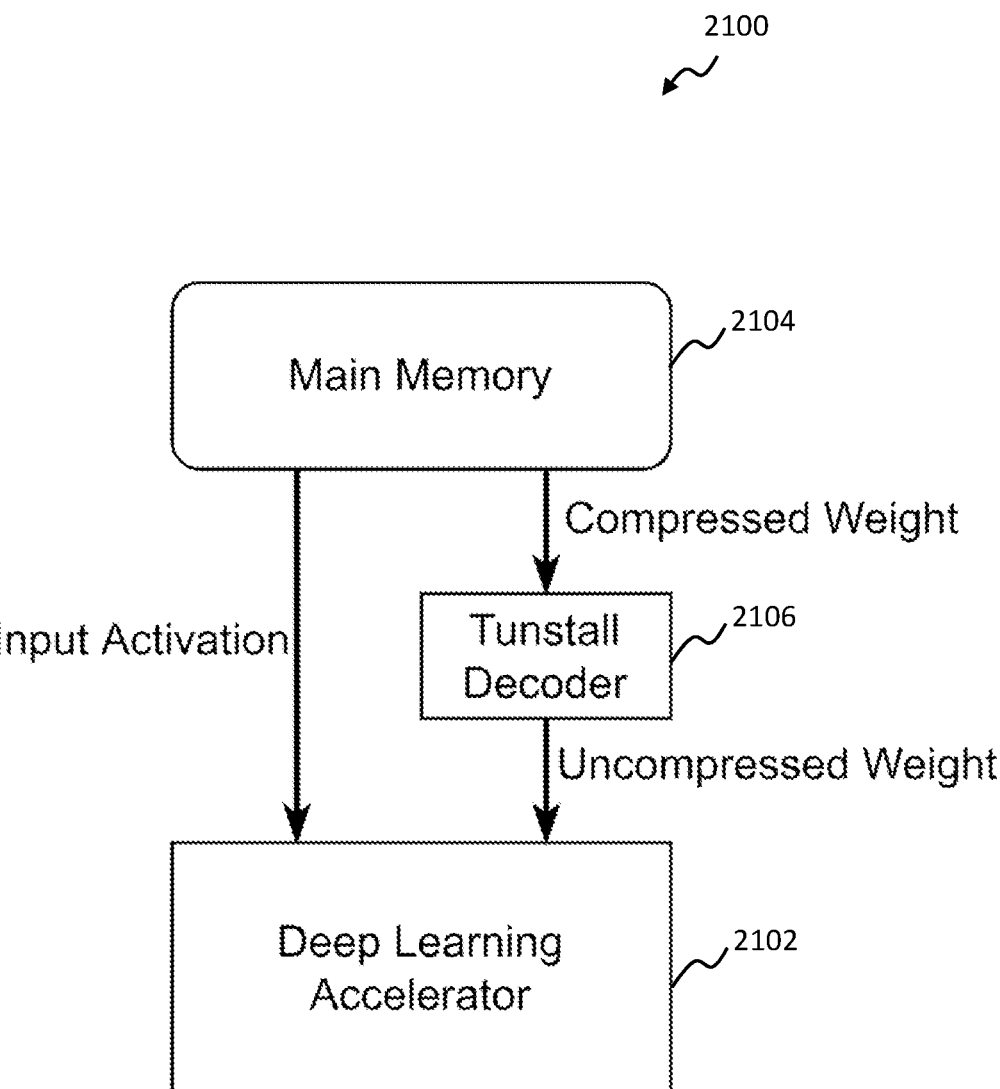
FIG. 21 depicts a schematic drawing of a deep learning accelerator system according to various example embodiments of the present invention.

In various example embodiments, the MO or LO decoder may be integrated into a system-on-chip (SoC) platform (e.g., Pulpissimo SoC platform). FIG. 21 depicts a schematic drawing of a deep learning accelerator system 2100 according to various example embodiments of the present invention. The system 2100 comprise a deep learning accelerator 2102, a memory 2104 and a decoder 2106 according to various example embodiments of the present invention, such as the MO or LO decoder as described hereinbefore according to various example embodiments. As shown in FIG. 21, the deep learning accelerator 2102 is configured to receive input activation from the memory 2104 directly. The decoder 2106 is configured to receive compressed weights (corresponding to an input codeword as described hereinbefore) and decode the compressed weights to uncompressed weights (corresponding to decoded symbols as described hereinbefore) for the deep learning accelerator 2102. Accordingly, when performing inference, input activation may be sent directly from the memory 2104 to the deep learning accelerator 2102, while the compressed weights may be fetched from the memory 2104 and decoded by the decoder 2106. The uncompressed weights decoded by the decoder 2016 may then be sent to the deep learning accelerator 2102.

Evaluation Results

The uncompressed weights are assumed to require a slow, but large capacity memory (e.g., eDRAM, whose power consumption is 15 pJ/Byte). In addition, for the compressed situations, codebooks and codewords are stored in the on-chip memory (e.g., MRAM, whose power consumption is 2 pJ/Byte) and decoding is done by reading on-chip LUT (register files, whose power consumption is 0.2 pJ/Byte). A 32-bit word per single read access is also assumed. In addition, the decoder's clock and the accelerator's clock are assumed to have the same frequency.

In relation to the main memory entries requirements, FIG. 22 depicts a table (Table IV) summarizing the memory capacity requirements to store the weights of ResNet-50 and MobileNet-v2 CNNs in different coding methods. In particular, 32-bit floating point, quantized 8- and 4-bit, the two Tunstall coding as described hereinbefore according to various example embodiments, and Huffman encoding were considered. It can be seen that both Tunstall and Huffman coding require 18.0× and 2.3× less than full precision and 4-bit weights on average. Huffman coding occupies around 4 percentages less capacity than the two Tunstall MO and LO coding according to various example embodiments of the present invention.

In relation to the estimated memory access power consumption, Table IV in FIG. 22 also shows the estimated power consumption needed to access all the weights. From table IV, for ResNet-50, it can be seen that the LO decoder costs 2.7% energy to access all the weights compared with the full precision and 21.9% energy compared with the start-of-the-art quantized 4-bit weights. For example, the MO decoder only cost 0.9% and 7.6% compared with full precision and quantized 4-bit weights. It can also be seen that the MO decoder consumes similar power with the Huffman decoder.

In relation to the weight read clock cycles, FIG. 23 depicts a table (Table V) showing memory access cycles in different methods. For example, it can be seen that the LO decoder reaches a 9.9× on ResNet-50 and 13.9× on MobileNet-v2 speedup on reading weights compared with off-chip DRAM.

In relation to the resource utilization overheads, after integrating the decoder 2106 into Pulpissimo, they are synthesised by Vivado 2020.1 without optimization. The MO 1024 RAM decoder and LO 8 SD 27 banks decoder only bring 2.16% and 8.14% resource overheads, which is affordable. The MO 64 RAM decoder only brings 0.48% overhead for such a system.

Comparing the Tunstall Coding and Huffman Coding

As an example, the performances of the 7-stage 24 memory banks LO Tunstall decoder and the 1024 entries MO Tunstall decoder with the 256 entries Huffman decoder will be compared. The Huffman decoder decodes one weight per clock cycle. FIG. 24 depicts a Table (Table VI) showing the performance of the above-mentioned LO Tunstall decoder and MO Tunstall decoder for ResNet-50.

Storage of the Codewords

FIGS. 25A and 25B show two examples Tunstall and Huffman codewords, respectively, stored in two 32-bit main memory cells. There are six 10-bit Tunstall codewords in FIG. 25A which can be decoded into 17 uncompressed symbols while the number bits of Huffman codewords in FIG. 25B varies from one to seven, which is extremely irregular. These 64 bits Huffman codewords represent 18 uncompressed symbols. In FIG. 25, the two most significant bits represent the number of valid codewords in the 32-bit memory cell.

Decoding Clock Cycles

In relation to software decoding time, FIG. 26 depicts a table (Table VII) showing the Tunstall and Huffman software decoding time (microseconds). It can be seen that it is around 1.5× faster to decode Tunstall codewords than Huffman codewords for the same CNNs, although in some small and simple layers, Huffman decoders perform better than the Tunstall decoder.

In relation to hardware decoding clock cycles, as shown in Table VI in FIG. 24, the 1024 entries MO Tunstall decoder and the 7-stages LO Tunstall decoder are 6.23× and 3.29× faster than the Huffman decoder in ResNet-50.

Accordingly, the decoders according to various embodiments and example embodiments of the present invention can advantageously be employed in numerous commercial applications. For example, two hardware-accelerated decoders are designed and implemented according to various example embodiments of the present invention, namely memory-oriented (MO) Tunstall decoder and logic-oriented (LO) Tunstall decoder. For example, as described above, the decoders can be used for on-the-fly decoding of compressed neural network parameters. For example, this is important for applying artificial intelligence in ultra low-power platforms. For example, as described above, various example embodiments adopt Tunstall coding to further compress weights after state-of-the-art quantization. For example, compared with the full precision 32-bit networks, the MO decoder reduces 19.58× and 21.67× memory usage in the inference stage on ResNet-50 and MobileNet-v2 respectively, while the LO decoder reduces 19.76×and 22.08×. The MO and LO decoders have also been found to be around 6× and 3× faster than Huffman coding. Accordingly, for example, this demonstrates that the Tunstall decoders according to various example embodiments of the present invention are suitable for integration in the deep learning accelerator to significantly reduce the memory usage while bring little latency and resources overheads. However, it will be appreciated by a person skilled in the art that the decoders according to various embodiments or example embodiments of the present invention, such as on-the-fly decoding, are not limited to neural network and artificial intelligence, and may be applied to various applications as desired or as appropriate, such as to provide an additional layer of security to further confiscate private keys and sensitive data.

While embodiments of the invention have been particularly shown and described with reference to specific embodiments, it should be understood by those skilled in the art that various changes in form and detail may be made therein without departing from the scope of the invention as defined by the appended claims. The scope of the invention is thus indicated by the appended claims and all changes which come within the meaning and range of equivalency of the claims are therefore intended to be embraced.

What is claimed is:

1. A decoder for decoding a codeword of a Tunstall code, the decoder comprising:

a sub-decoder configured to receive an input codeword of the Tunstall code to the decoder and output a decoded symbol of the input codeword;

a symbol memory configured to receive and store the decoded symbol of the input codeword from the sub-decoder; and a controller configured to control the symbol memory to output one or more decoded symbols stored in the symbol memory, wherein the sub-decoder comprises:

a node memory configured to store, for a plurality of nodes of a Tunstall tree of the Tunstall code corresponding to a first level of the Tunstall tree, a plurality of codewords of the Tunstall code assigned to the plurality of nodes, respectively; and a comparator configured to compare the input codeword with the plurality of codewords assigned to the plurality of nodes corresponding to the first level of the Tunstall tree received from the node memory and produce the decoded symbol of the input codeword with respect to the first level of the Tunstall tree based on the comparison.

2. The decoder according to claim 1, wherein said produce the decoded symbol of the input codeword with respect to the first level of the Tunstall tree comprises:

determining one of the plurality of nodes corresponding to the first level of the Tunstall tree as a determined node for the first level of the Tunstall tree based on the comparison; and producing the decoded symbol of the input codeword with respect to the first level of the Tunstall tree based on the determined node.

3. The decoder according to claim 2, wherein the sub-decoder is further configured to:

determine whether the determined node for the first level of the Tunstall tree has associated therewith a descendant node, the descendant node being two levels down from the determined node according to the Tunstall tree; and obtain an address of a plurality of nodes of the Tunstall tree corresponding to a next level of the Tunstall tree with respect to the first level of the Tunstall tree based on determining that the determined node for the first level of the Tunstall tree has associated therewith the descendent node.

4. The decoder according to claim 3, wherein the sub-decoder further comprises a selector communicatively coupled to the comparator and the node memory and configured to perform said determine whether the determined node for the first level of the Tunstall tree has associated therewith the descendant node and said obtain the address of the plurality of nodes of the Tunstall tree corresponding to the next level of the Tunstall tree.

5. The decoder according to claim 3, further comprising one or more additional sub-decoders, wherein the sub-decoder is a first sub-decoder is associated with the first level of the Tunstall tree, the one or more additional sub-decoders are associated with one or more additional levels of the Tunstall tree, respectively, each of the one or more additional sub-decoders is configured to receive the input codeword and output a decoded symbol of the input codeword with respect to the level of the Tunstall tree associated with the additional sub-decoders and comprises:

a node memory configured to store, for a plurality of nodes of the Tunstall tree of the Tunstall code corresponding to the level of the Tunstall tree associated with the additional sub-decoder, a plurality of codewords of the Tunstall code assigned to the plurality of nodes, respectively; and a comparator configured to compare the input codeword with the plurality of codewords assigned to the plurality of nodes corresponding to the level of the Tunstall tree associated with the additional sub-decoder received from the node memory and produce a decoded symbol of the input codeword with respect to the level of the Tunstall tree associated with the additional sub-decoder based on the comparison.

6. The decoder according to claim 5, wherein said produce the decoded symbol of the input codeword with respect to the level of the Tunstall tree associated with the additional sub-decoder comprises:

determining one of the plurality of nodes corresponding to the level of the Tunstall tree as a determined node for the level of the Tunstall tree based on the comparison; and producing the decoded symbol of the input codeword with respect to the level of the Tunstall tree associated with the additional sub-decoder based on the determined node.

7. The decoder according to claim 6, wherein the first sub-decoder is configured to, based on determining that the determined node for the first level of the Tunstall tree associated with the first sub-decoder has associated therewith the descendent node, output the address of the plurality of nodes corresponding to the next level of the Tunstall tree with respect to the first level of the Tunstall tree to an additional sub-decoder of the one or more additional sub-decoders associated with the next level of the Tunstall tree for the comparator of the additional sub-decoder to compare the input codeword with the plurality of codewords assigned to the plurality of nodes corresponding to the next level of the Tunstall tree received from the node memory of the additional sub-decoder based on the address of the plurality of nodes received and produce the decoded symbol of the input codeword with respect to the next level of the Tunstall tree associated with the additional sub-decoder based on the comparison, and the additional sub-decoder is further configured to output the decoded symbol of the input codeword with respect to the next level of the Tunstall tree associated with the additional sub-decoder to the symbol memory.

8. The decoder according to claim 6, wherein each additional sub-decoder of the one or more additional sub-decoders is configured to, based on determining that the determined node for the level of the Tunstall tree associated with the additional sub-decoder has associated therewith the descendent node, output an address of the plurality of nodes corresponding to a next level of the Tunstall tree with respect to the level of the Tunstall tree to another additional sub-decoder associated with the next level of the Tunstall tree for the comparator of said another additional sub-decoder to compare the input codeword with the plurality of codewords assigned to the plurality of nodes corresponding to the next level of the Tunstall tree received from the node memory of said another additional sub-decoder based on the address of the plurality of nodes received and produce the decoded symbol of the input codeword with respect to the next level of the Tunstall tree based on the comparison, and said another additional sub-decoder is further configured to output the decoded symbol of the input codeword with respect to the next level of the Tunstall tree to the symbol memory.

9. The decoder according to claim 6, wherein each sub-decoder of the first sub-decoder and the one or more additional sub-decoders is configured to, based on determining that the determined node for the level of the Tunstall tree associated with the sub-decoder does not have associated therewith the descendent node, determine whether the determined node for the level of the Tunstall tree associated with the sub-decoder has associated therewith a child node, wherein the child node is one level down from the determined node according to the Tunstall tree, and the decoder further comprises a subtractor configured to, based on the sub-decoder determining that the determined node for the level of the Tunstall tree associated with the sub-decoder has associated therewith the child node, produce a decoded symbol of the input codeword with respect to a next level of the Tunstall tree with respect to the level of the Tunstall tree based on the input codeword and the codeword assigned to the determined node for the level of the Tunstall tree associated with the sub-decoder.

10. The decoder according to claim 3, wherein the node memory is configured to store, for each level of a plurality of levels of the Tunstall tree, including the first level of the Tunstall tree, and for a plurality of nodes of the Tunstall tree corresponding to the level of the Tunstall tree, a plurality of codewords of the Tunstall code assigned to the plurality of nodes corresponding to the level of the Tunstall tree, respectively.

11. The decoder according to claim 10, wherein the comparator is configured to, based on the sub-decoder determining that the determined node for a level of the Tunstall tree has associated therewith the descendent node:

compare the input codeword with the plurality of codewords assigned to the plurality of nodes of the Tunstall tree corresponding to a next level of the Tunstall tree with respect to the level of the Tunstall tree received from the node memory based on an address of the plurality of nodes of the Tunstall tree corresponding to the next level of the Tunstall tree;

determine one of the plurality of nodes corresponding to the next level of the Tunstall tree as a determined node for the next level of the Tunstall tree based on the comparison; and produce a decoded symbol of the input codeword with respect to the next level of the Tunstall tree based on the determined node for the next level of the Tunstall tree, and the sub-decoder is further configured to output the decoded symbol of the input codeword with respect to the next level of the Tunstall tree to the symbol memory.

12. The decoder according to claim 10, wherein the sub-decoder is further configured to, based on determining that the determined node for a level of the Tunstall tree does not have associated therewith the descendent node, determine whether the determined node for the level of the Tunstall tree has associated therewith a child node, wherein the child node is one level down from the determined node according to the Tunstall tree, and the decoder further comprises a subtractor configured to, based on the sub-decoder determining that the determined node for the level of the Tunstall tree has associated therewith the child node, produce a decoded symbol of the input codeword with respect to a next level of the Tunstall tree with respect to the level of the Tunstall tree based on the input codeword and the codeword assigned to the determined node for the level of the Tunstall tree.

13. The decoder according to claim 1, wherein the symbol memory comprises a plurality of memory banks, each memory bank being configured to store one or more decoded symbols of a corresponding codeword, and the controller is configured to control the symbol memory to output, for each of the plurality of memory banks, the one or more decoded symbols of the corresponding codeword stored in the memory bank.

14. The decoder according to claim 1, wherein the input codeword corresponds to compressed quantized weights of a neural network, and the one or more decoded symbols of the input codeword stored in the symbol memory and output from the decoder correspond to uncompressed quantized weights of the neural network.

15. A method of operating the decoder for decoding a codeword of a Tunstall code according to claim 1, the method comprising:

receiving, by the sub-decoder of the decoder, an input codeword of the Tunstall code to the decoder;

outputting, by the sub-decoder, a decoded symbol of the input codeword;

receiving and storing, by the symbol memory of the decoder, the decoded symbol of the input codeword from the sub-decoder; and controlling, by the controller of the decoder, the symbol memory to output one or more decoded symbols stored in the symbol memory, wherein the method further comprises comparing, by the comparator of the sub-decoder, the input codeword with the plurality of codewords assigned to the plurality of nodes corresponding to the first level of the Tunstall tree received from the node memory of the sub-decoder and producing, by the comparator, the decoded symbol of the input codeword with respect to the first level of the Tunstall tree based on the comparison.

16. A decoder for decoding a codeword of a Tunstall code, the decoder comprising:

a symbol memory comprising a plurality of memory entries, each memory entry having stored therein one or more decoded symbols of a codeword of the Tunstall code corresponding to the memory entry; and a controller configured to receive an input codeword of the Tunstall code to the decoder and control the symbol memory to output the one or more decoded symbols stored in one of the plurality of memory entries corresponding to the input codeword.

17. The decoder according to claim 16, wherein said control the symbol memory to output the one or more decoded symbols stored in one of the plurality of memory entries corresponding to the input codeword is based on the input codeword functioning as an address to said one of the plurality of memory entries.

18. The decoder according to claim 16, wherein the symbol memory is an on-chip memory, the controller is communicatively coupled to the symbol memory and an off-chip memory, wherein the plurality of memory entries of the symbol memory have stored therein the one or more decoded symbols of a first plurality of codewords of the Tunstall code, respectively, and the off-chip memory has stored therein, for each of a second plurality of codewords of the Tunstall code, one or more decoded symbols of the codeword, and the controller is configured to determine whether the one or more decoded symbols of the input codeword is located in the symbol memory or the off-chip memory, and control the determined one of the symbol memory and the off-chip memory to output the one or more decoded symbols of the input codeword.

19. The decoder according to claim 18, wherein the plurality of memory entries of the symbol memory are updated with one or more decoded symbols of a plurality of remapped codewords, respectively, the plurality of remapped codewords being at a plurality of codebook entries of an updated codebook replacing a plurality of codewords previously thereat having highest frequency counts.

20. The decoder according to claim 16, wherein each of the plurality of memory entries of the symbol memory has further stored therein a symbol number parameter indicating the number of decoded symbols of a corresponding codeword stored in the memory entry.

* * * * *